(12) United States Patent
Ogura et al.

(10) Patent No.: US 6,891,224 B2
(45) Date of Patent: May 10, 2005

(54) SEMICONDUCTOR DEVICE

(75) Inventors: Tsuneo Ogura, Kanagawa (JP); Tomoki Inoue, Tokyo (JP); Hideaki Ninomiya, Kanagawa (JP); Koichi Sugiyama, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/461,345

(22) Filed: Jun. 16, 2003

(65) Prior Publication Data
US 2004/0041171 A1 Mar. 4, 2004

(30) Foreign Application Priority Data
Jun. 19, 2002 (JP) ........................................ 2002-178250

(51) Int. Cl.$^7$ .......................... H01L 29/76; H01L 29/94; H01L 31/062
(52) U.S. Cl. ........................ 257/330; 257/329; 257/331
(58) Field of Search .............................. 257/330, 329, 257/331

(56) References Cited
U.S. PATENT DOCUMENTS

| 5,751,024 A | 5/1998 | Takahashi |
| 6,001,678 A | 12/1999 | Takahashi |
| 6,040,599 A | 3/2000 | Takahashi |
| 6,221,721 B1 | 4/2001 | Takahashi |
| 6,359,306 B1 | 3/2002 | Ninomiya |
| 6,566,691 B1 | 5/2003 | Inoue |

OTHER PUBLICATIONS

H. Takahashi, et al., Proceedings of 2001 International Symposium on Power Semiconductor Devices & ICs, pp. 445–448, "600V CSTBT Having Ultra Low On–State Voltage", 2001.

*Primary Examiner*—Steven Loke
(74) *Attorney, Agent, or Firm*—Oblon, Spivak, McClelland, Maier & Neustadt, P.C.

(57) ABSTRACT

A semiconductor device includes: a base layer of a first conductivity type, a barrier layer of a first conductivity type formed on the base layer, a well layer of a second conductivity type formed on the barrier layer; a trench formed from the surface of the well layer to such a depth as to reach a region in the vicinity of a junction surface between the barrier layer and the base layer, a gate electrode formed in the trench via a gate insulating film, a contact layer of the second conductivity type selectively formed in a surface portion of the well layer, a source layer of the first conductivity type selectively formed in the surface portion of the well layer so as to contact a side wall of the gate insulating film in the trench and the contact layer, and a first main electrode formed so as to contact the contact layer and the source layer, wherein assuming that a total sum of impurity densities in the region of the barrier layer between the trenches is Qn, the Qn has a relation of the following equation: $Qn \geq 2 \times 10^{12}$ cm$^{-2}$.

9 Claims, 25 Drawing Sheets

| | | ON-RESISTANCE | BREAKDOWN VOLTAGE |
|---|---|---|---|
| STRUCTURE EXAMPLE ACCORDING TO RELATED ART | a=2 μm<br>Qn=1×10¹² cm⁻² | 5V | 5000V |
| EXAMPLE 1 OF IGBT 4 | a=2 μm<br>Qn=2×10¹² cm⁻² | 4V | 3000V |
| EXAMPLE 2 OF IGBT 4 | a=1 μm<br>Qn=2×10¹² cm⁻² | 3.5V | 5000V |
| EXAMPLE 3 OF IGBT 4 | a=1 μm<br>Qn=5×10¹² cm⁻² | 2V | 5000V |

$Q_n$: TOTAL SUM OF IMPURITY DENSITY IN n-TYPE REGION BETWEEN TRENCHES

ON-STATE

TURN-OFF STATE

SEMICONDUCTOR DEVICE

CROSS REFERENCE TO RELATED APPLICATION

This application claims benefit of priority under 35USC §119 to Japanese patent application No. 2002-178250, filed on Jun. 19, 2002, the contents of which are incorporated by reference herein.

BACKGROUND OF THE INVENTION

1. Field of the Invention

The present invention relates to a semiconductor device, for example, a power semiconductor device which realizes a low on-resistance.

2. Related Background Art

In recent years, an insulated gate bipolar transistor (IGBT) has broadly been used as a power semiconductor device which has a breakdown voltage of 600 V or more. Since this power semiconductor device is generally used as a switch, a low on-resistance and a high switching rate are requested.

An IGBT according to a conventional art will be described with reference to FIGS. 27 and 28. It is to be noted that in drawings described later, the same components are denoted with the same reference numerals, and the detailed description thereof is appropriately omitted.

FIG. 27 is a sectional view schematically showing one example of the IGBT comprising a trench gate structure which has recently been used broadly. An IGBT 110 shown in the figure comprises an $n^-$-type base layer 142, a $p^+$-type emitter layer 44, a collector electrode 56, p-type well layers 160, $n^+$-type source layers 148, an emitter electrode 158, gate oxide films 52, and a gate electrode 54. The $p^+$-type emitter layer 44 is formed on the undersurface of the $n^-$-type base layer 142 on the lower side in the sheet of the figure, and the collector electrode 56 is disposed in contact with the $p^+$-type emitter layer 44. The p-type well layer 160 is formed in the upper surface of the $n^-$-type base layer 142 in the sheet of the figure. A trench TRa is selectively formed halfway in the depth of the $n^-$-type base layer 142 from the surface of the p-type well layer 160 through the p-type well layer 160, and the gate electrode 54 is disposed via the gate oxide film 52 in the trench. In the $n^-$-type base layer 142, a width $2a$ of an active region held between the gate oxide films 52 is usually, for example, $2a=4$ μm. The $n^+$-type source layer 148 is selectively formed in contact with a trench TR52 in the surface portion of the p-type well layer 160. Furthermore, the emitter electrode 158 is disposed so as to extend to the surface of the $n^+$-type source layer 148 from the upper surface of the p-type well layer 160, thereby the emitter electrode 158 contacts the p-typewell layer 160 and $n^+$-type source layer 148.

An operation of the IGBT 110 shown in FIG. 27 is as follows.

When a bias voltage which is positive with respect to the emitter electrode 158 is applied to the gate electrode 54, an inversion layer is generated in the p-type well layer 160 in a region in the vicinity of the outer surface of the gate oxide film 52, and electrons are injected into the $n^-$-type base layer 142. Accordingly, a positive hole is injected into the $n^-$-type base layer 142 from the $p^+$-type emitter layer 44, which turns the IGBT 110 on. The positive hole injected at this time runs in the $n^-$-type base layer 142 to flow into the p-type well layer 160.

However, the related-art IGBT 110 shown in FIG. 27 has the following two problems.

A first problem is that, due to the positive hole flowing into the p-type well layer 160, accumulation of the positive hole decreases in the vicinity of an interface between the $n^-$-type base layer 142 and the p-type well layer 160, and carriers are reduced. As a result, the on-resistance of the device increases.

A second problem is a drop in destruction tolerance by a so-called latch up phenomenon. Specifically, when the IGBT 110 is turned off, a potential of the p-type well layer 160 may rise by a positive-hole current discharged through the p-type well layer 160, and the destruction tolerance of the IGBT 110 may drop by the electrons injected into the p-type well layer 160 from the $n^+$-type source layer 148. This is because with the increase of a breaking current, the positive-hole current flowing right under the $n^+$-type source layer 148 increases.

To solve the first problem, the use of the Injection Enhancement (IE) effect has been known in which an n-type impurity layer is formed in a lower part of the p-type well layer 160 to increase an accumulated amount of the positive hole and to reduce the on-resistance. However, when the n-type impurity layer is formed in the lower part of the p-type well layer 160, a breakdown voltage of the device itself is deteriorated. Thus, there is a limitation in raising a density of the n-type impurity layer. For the limit value, for example, an impurity total amount is in a range of about 1 to $2 \times 10^{12}$ cm$^{-2}$, and the density is in a range of about $10^{14}$ to $10^{15}$ cm$^{-3}$. Therefore, there is a limitation in reduction of the on-resistance by the n-type impurity layer disposed in the lower part of the p-type well layer 160, and the on-resistance cannot be sufficiently lowered as that in a thyristor.

It is known that another means for solving the first problem comprises: further disposing dummy trenches TRd, which has no relation with the operation of the device, between active trenches TRa which contribute to the operation of the device, for example, as in an IGBT 120 shown in FIG. 28; and forming an oxide film 162 in the surface of the semiconductor layer between the dummy trenches TRd. Since this constitution interrupts contact of the semiconductor layer between the dummy trenches TRd with an emitter electrode 58, the resistance increases in discharging the positive hole to the emitter electrode 58 from an $n^-$-type base layer 42. As a result, the accumulated amount of the positive hole can be increased. It is to be noted that to control the injection of the positive hole into the $n^-$-type base layer 42 from the $p^+$-type emitter layer 44 in the IGBT 120 shown in FIG. 28, an n-type buffer layer 66 is inserted between these layers. To reduce an input capacity, dummy electrodes 154 in the dummy trenches TRd having no contact with a current passage are connected to the emitter electrode 58.

However, according to researches of the present inventors, in the constitution shown in FIG. 28, a surface recombination occurs in an interface portion shown by a dot line DL between the $n^-$-type base layer 42 and a dummy gate oxide film 172. Since the accumulated amount of the positive hole drops accordingly, it has been found out to be difficult to reduce the on-resistance.

As described above, the related-art IGBT comprising the trenchgate structure has both the first problem that it is difficult to reduce the on-resistance and the second problem that with the increase of the breaking current, the positive-hole current flowing through the p-type well increases and the device may be destroyed.

BRIEF SUMMARY OF THE INVENTION

According to a first aspect of the present invention, there is provided a semiconductor device comprising: a base layer of a first conductivity type; a barrier layer of a first conductivity type formed on the base layer; a trench formed from the surface of the barrier layer to such a depth as to reach a region in the vicinity of an interface between the barrier layer and the base layer; a gate electrode formed in the trench via a gate insulating film; a contact layer of a second conductivity type selectively formed in a surface portion of the barrier layer; a source layer of the first conductivity type selectively formed in the surface portion of the barrier layer so as to contact the contact layer and a side wall of the gate insulating film in the trench; and a first main electrode formed so as to contact the contact layer and the source layer.

According to a second aspect of the present invention, there is provided a semiconductor device comprising: a base layer of a first conductivity type; a barrier layer of the first conductivity type formed above the base layer; a trench formed from the surface of the barrier layer to such a depth as to reach a region in the vicinity of an interface between the barrier layer and the base layer; a gate electrode formed in the trench via a gate insulating film; a contact layer of a second conductivity type selectively formed in a surface portion of the barrier layer; a source layer of the first conductivity type selectively formed in the surface portion of the barrier layer so as to contact a side wall of the gate insulating film in the trench and the contact layer; a well layer of the second conductivity type formed between the contact layer and the source layer, and the barrier layer; and a first main electrode formed so as to contact the contact layer and the source layer, wherein the region between the trenches includes a dummy region having no relation to the operation of the device other than an active region for a current path.

According to a third aspect of the present invention, there is provided a semiconductor device comprising: a base layer of a first conductivity type; a barrier layer of the first conductivity type formed on the base layer; a well layer of a second conductivity type formed on the barrier layer; a trench formed from the surface of the well layer to such a depth as to reach a region in the vicinity of an junction surface between the barrier layer and the base layer; a gate electrode formed in the trench via a gate insulating film; a contact layer of the second conductivity type selectively formed in a surface portion of the well layer; a source layer of the first conductivity type selectively formed in the surface portion of the well layer so as to contact a side wall of the gate insulating film in the trench and the contact layer; and a first main electrode formed so as to contact the contact layer and the source layer, wherein assuming that a total sum of impurity densities in the region of the barrier layer between the trenches is Qn, the Qn has a relation of the following equation:

$Qn \geq 2 \times 10^{12}$ cm$^{-2}$.

According to a fourth aspect of the present invention, there is provided a semiconductor device comprising: a base layer of a first conductivity type; a well layer of a second conductivity type formed on the base layer; an active trench formed from the surface of the well layer to such a depth as to reach the inside of the base layer so as to sandwich an active region to form a current path in the well layer; a dummy trench formed in the region excluding the active region of the well layer from the surface of the well layer to such a depth as to reach the inside of the base layer; a gate electrode formed in the active trench via a gate insulating film; a dummy electrode formed in the dummy trench via the gate insulating film; a source layer of the first conductivity type selectively formed in a surface portion of the active region of the well layer so as to contact a side wall of the gate insulating film in the active trench; and a first main electrode formed so as to contact at least the well layer and the source layer, wherein the dummy electrode in the dummy trench disposed adjacent to the active trench is electrically connected to the gate electrode, and the dummy electrode other than that of the dummy trench disposed adjacent to the active trench is electrically connected to the first main electrode.

According to a fifth aspect of the present invention, there is provided a semiconductor device comprising: a base layer of a first conductivity type; a well layer of a second conductivity type formed on the base layer; an active trench formed from the surface of the well layer to such a depth as to reach the inside of the base layer so as to sandwich an active region for a current path in the well layer; a dummy trench formed in the region excluding the active region of the well layer from the surface of the well layer to such a depth as to reach the inside of the base layer; a gate electrode formed in the active trench via a first gate insulating film; a dummy electrode formed in the dummy trench via a second gate insulating film; a source layer of the first conductivity type selectively formed in a surface portion of the well layer in the active region so as to contact a side wall of the gate insulating film in the active trench; and a first main electrode formed so as to contact the well layer and the source layer, wherein a distance between the dummy trench disposed adjacent to the active trench, and the active trench is shorter than that between the dummy trenches.

According to a sixth aspect of the present invention, there is provided a semiconductor device comprising: a base layer of a first conductivity type; a well layer of a second conductivity type selectively formed on an active region for a current path of the base layer; a diverter layer of the second conductivity type selectively formed in a region of the base layer excluding the active region; a first trench formed from the surface of the well layer to such a depth as to reach the inside of the base layer; a second trench formed from the surface of the diverter layer to such a depth as to reach the inside of the base layer; gate electrodes formed in the first and second trenches via insulating films; a source layer of the first conductivity type selectively formed in a surface portion of the active region of the well layer so as to contact a side wall of the gate insulating film in the first trench,; and a first main electrode electrically connected to the well layer, the source layer and the diverter layer.

DETAILED DESCRIPTION OF THE INVENTION

Some embodiments of the present invention will be described hereinafter with reference to the drawings. It is to be noted that IGBTs comprising vertical and horizontal trench gate structures will mainly be described hereinafter. However, the present invention is not limited to these semiconductor devices, and can be applied to other semiconductor devices, for example to general power semiconductor devices comprising trench MOS gate structures such as a vertical trench MOSFET and horizontal trench MOSFET. In the following embodiments, a first conductivity type is defined as an n-type and a second conductivity type is defined as a p-type.

(1) First Embodiment

Figure 1:
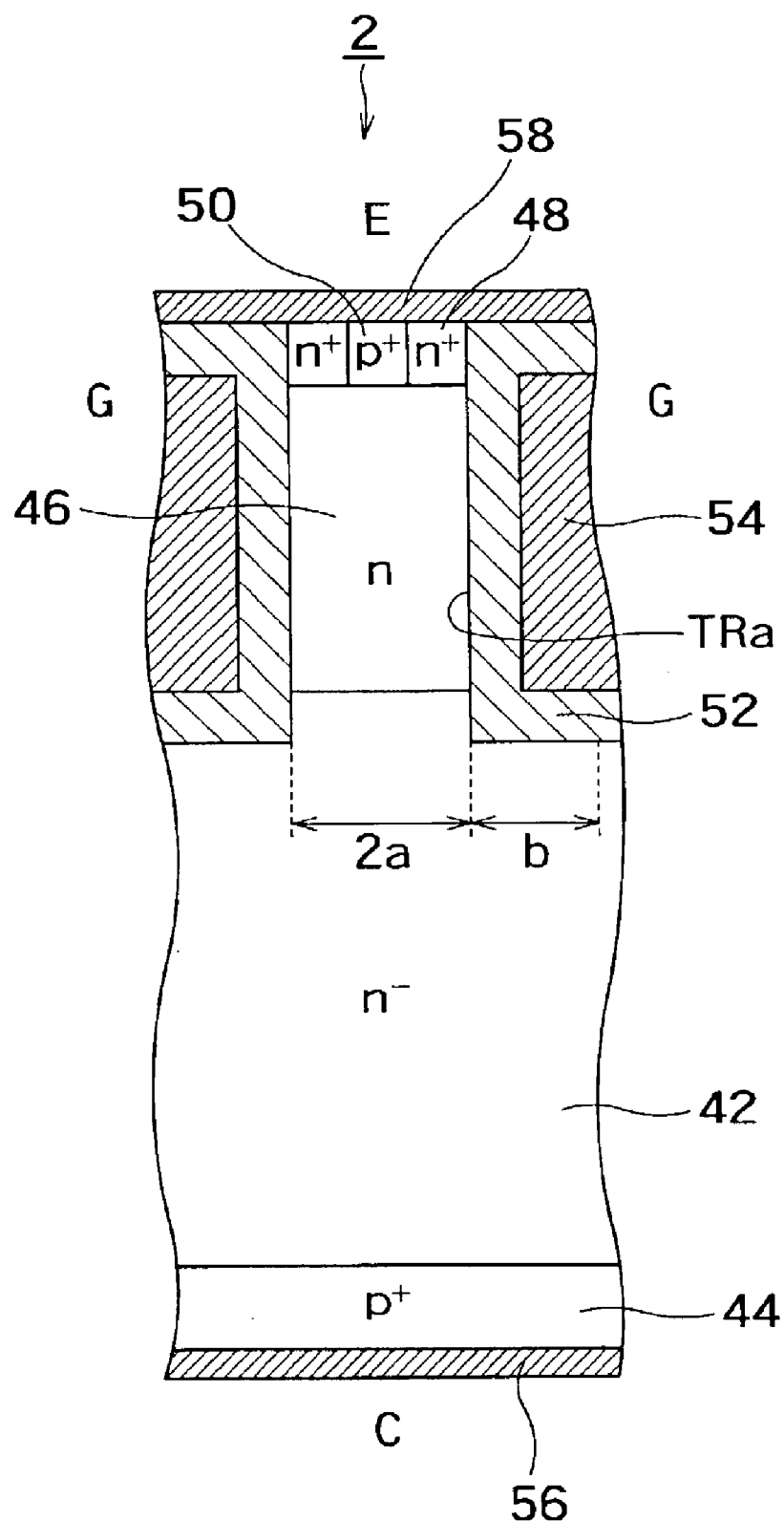
FIG. 1 is a sectional view showing a schematic constitution of a first embodiment of a semiconductor device according to the present invention.
Figure 27:
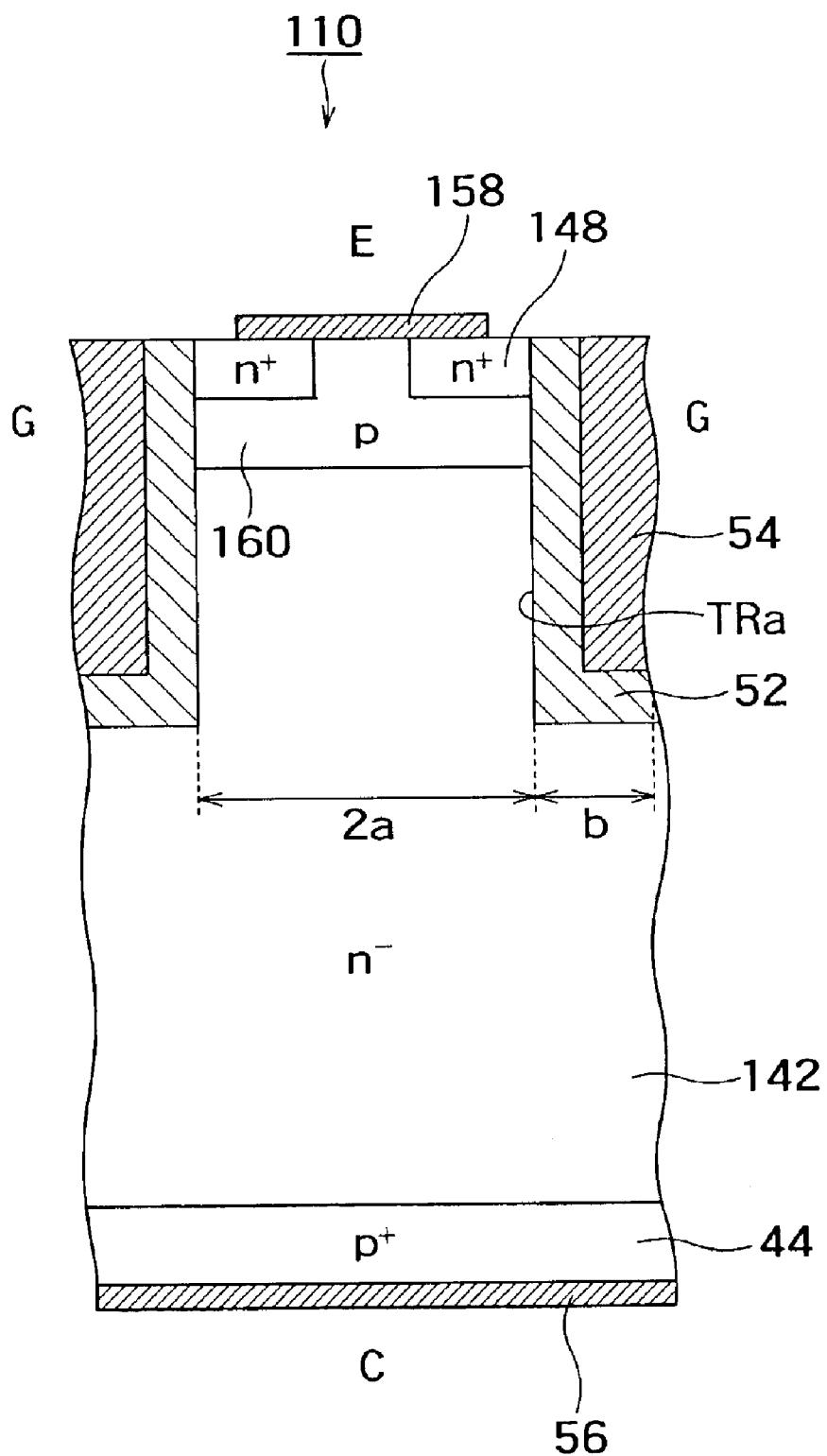
FIG. 27 is a schematic sectional view showing one example of the IGBT according to a related art.

FIG. 1 is a sectional view showing a schematic constitution of a first embodiment of a semiconductor device according to the present invention. As apparent from comparison with FIG. 27, characteristics of a semiconductor device 2 of the present embodiment lie in that a p-type well layer (see FIG. 27, reference numeral 160) is not disposed in the device 2 and that the width $2a$ of the active region in the $n^-$-type base layer 42 is formed to be smaller than that of the IGBT 110 of FIG. 27. In a region between the $n^+$-type source layers 48, a $p^+$-type contact layer 50 is formed. In the active region between trenches TRa, an n-type barrier layer 46 having an impurity concentration higher than that of the $n^-$-type base layer 42 contacts the $p^+$-type contact layer 50 and the $n^+$-type source layers 48 on the upper surface thereof. Furthermore, the n-type barrier layer 42 is formed so that the undersurface thereof reaches a depth which substantially corresponds to that of the undersurfaces of the gate electrodes 54. The width $2a$ of the active region is, for example, about 2 μm or less in the present embodiment, and this value is about the half or less of that of the related-art IGBT. The other structure of the semiconductor device 2 of the present embodiment is substantially the same as that of the IGBT 110 shown in FIG. 27.

Figures 2A, 2C, 2D:
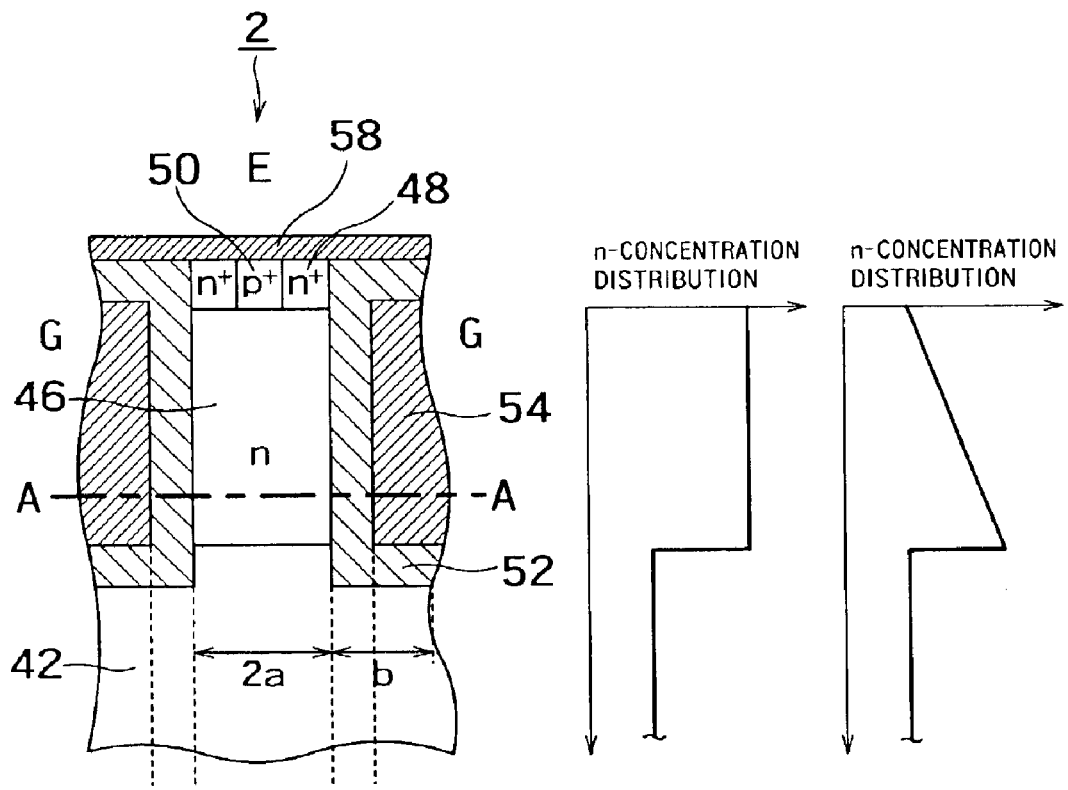
FIGS. 2A to 2E are explanatory views of the detailed constitution and operation principle of the IGBT shown in FIG. 1.
Figures 2B, 2E:
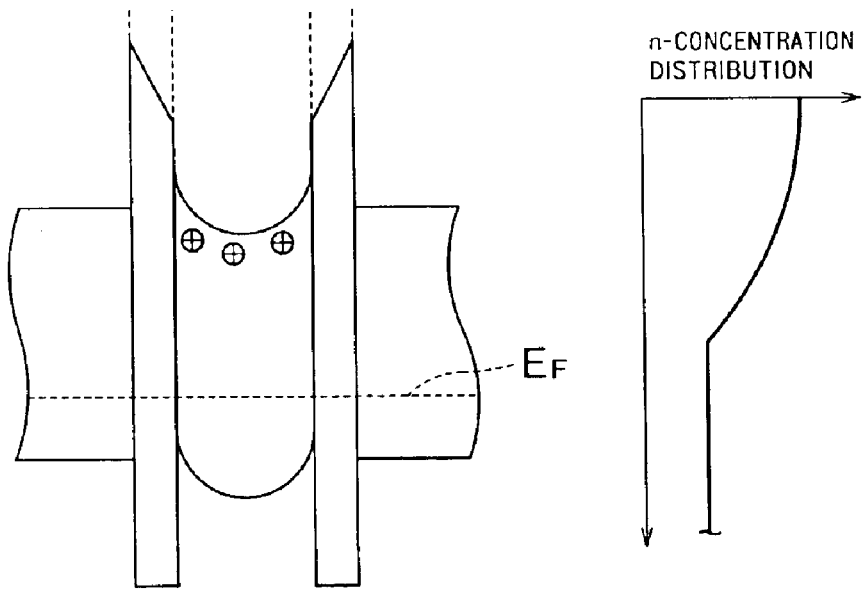

Detailed constitution and operation principle of the semiconductor device 2 shown in FIG. 1 will be described with reference to FIGS. 2A to 2E. FIG. 2A shows only a device sectional structure of an upper part of the semiconductor device 2 shown in FIG. 1. FIG. 2B is a schematic view of a potential of a portion cut along line A-A of FIG. 2A. Furthermore, FIGS. 2C to 2E show examples of concentration distributions of the n-type barrier layer 46 and $n^-$-type base layer 42.

A code $E_F$ shown in FIG. 2B represents Fermi level. The Fermi level $E_F$ shown in FIG. 2B is obtained using a p-type polysilicon as a material of the gate electrode 54. By this potential structure, the n-type barrier layer 46 is depleted. Therefore, even when a gate voltage is not applied, the device obtains a forward direction inhibitive state. At this time, density $N_{BAR}$ of the n-type barrier layer 46 substantially has the following relation with a i.e. the half width of the active region.

$$1\times10^{12} \text{ cm}^{-2} \approx N_{BAR} \text{ cm}^{-3} \times a \text{ cm} \qquad \text{Equation (1)}$$

For example, when $a=1\times10^{-4}$ cm (1 μm), $N_{BAR}=1\times10^{16}$ cm$^{-3}$, the obtained density is 100 or more times a usual density of the $n^-$-type base layer 42.

The operation of the semiconductor device 2 of the present embodiment is as follows. First, when a bias voltage having a positive direction with respect to the emitter electrode 58 is applied to the gate electrodes 54, a potential shown in FIG. 2B is lowered, and electrons are injected into the n⁻-type base layer 42 from the n⁺-type source layers 48 via the n-type barrier layer 46. The p⁺-type emitter layer 44 is thus biased in the positive direction with respect to the n⁻-type base layer 42, a positive hole is injected into the n⁻-type base layer 42 from the p⁺-type emitter layer 44, and the device is thereby brought into an on-state. The positive hole injected at this time runs through the n⁻-type base layer 42 and further flows into the n-type barrier layer 46. At this time, since the density $N_{BAR}$ of the n-type barrier layer 46 is high as described above, the positive hole can hardly flow into the p⁺-type contact layer 50. Therefore, accumulation of the positive hole occurs in the vicinity of a junction surface between the n⁻-type base layer 42 and the n-type barrier layer 46. As a result, the amount of carriers increases and the on-resistance drops.

Further as shown in FIG. 2D, the concentration distribution of the n-type barrier layer 46 may have a gradient, which distribution is more effective. On the contrary, when a converse gradient as shown in FIG. 2E is provided to the concentration distribution, manufacture of the device is facilitated since a diffusion step from the surface can be used.

(2) Second Embodiment

Figure 3:
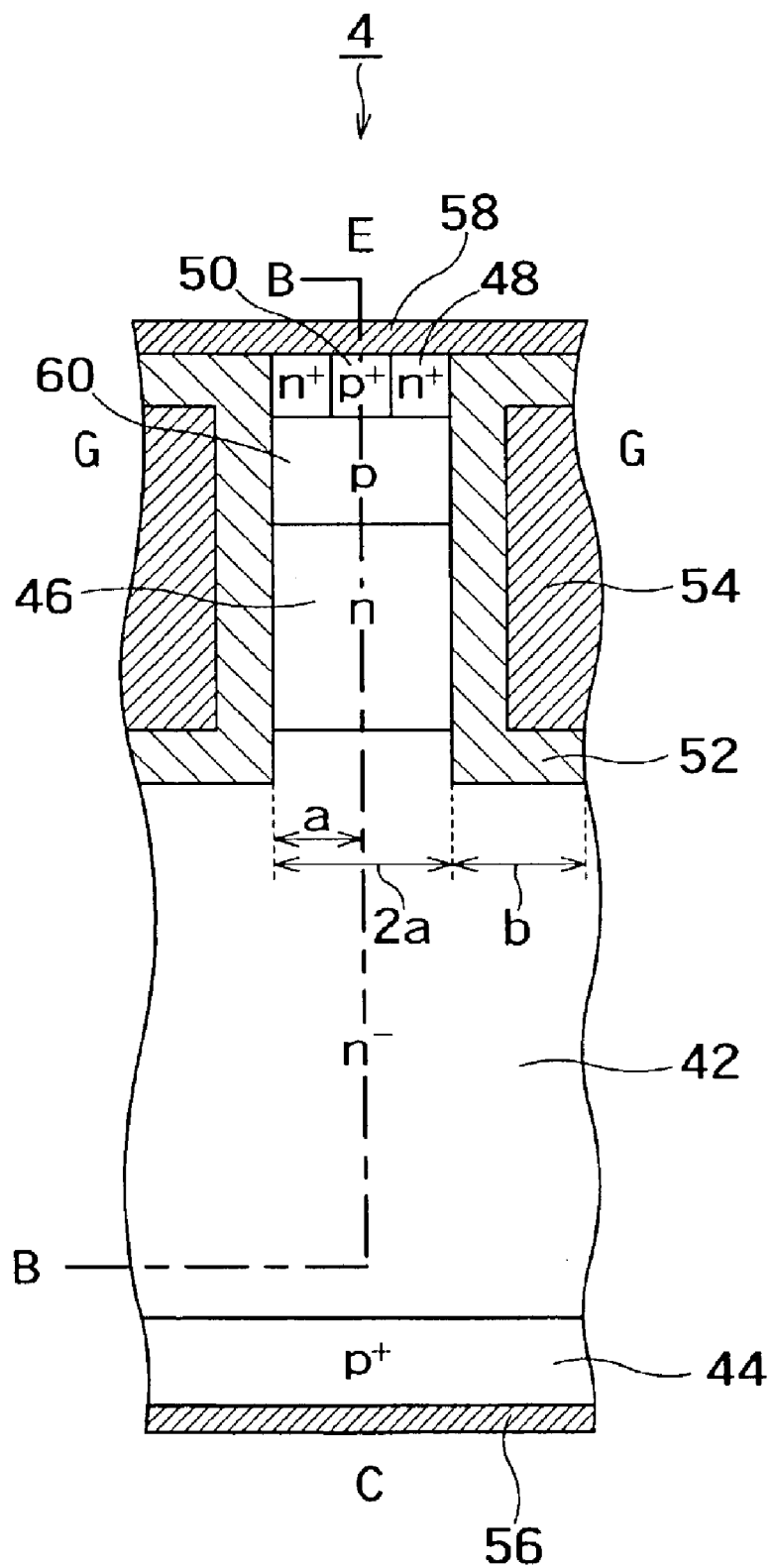
FIG. 3 is a sectional view showing the schematic constitution of a second embodiment of the semiconductor device according to the present invention.

FIG. 3 is a sectional view showing the schematic constitution of a second embodiment of the semiconductor device according to the present invention. As apparent from the comparison with FIG. 1, the characteristics of an IGBT 4 of the present embodiment lie in a p-type well layer 60 is disposed between the n⁺-type source layers 48 and a p⁺-type contact layer 58, and the n-type barrier layer 46.

Figures 4A, 4B, 5:
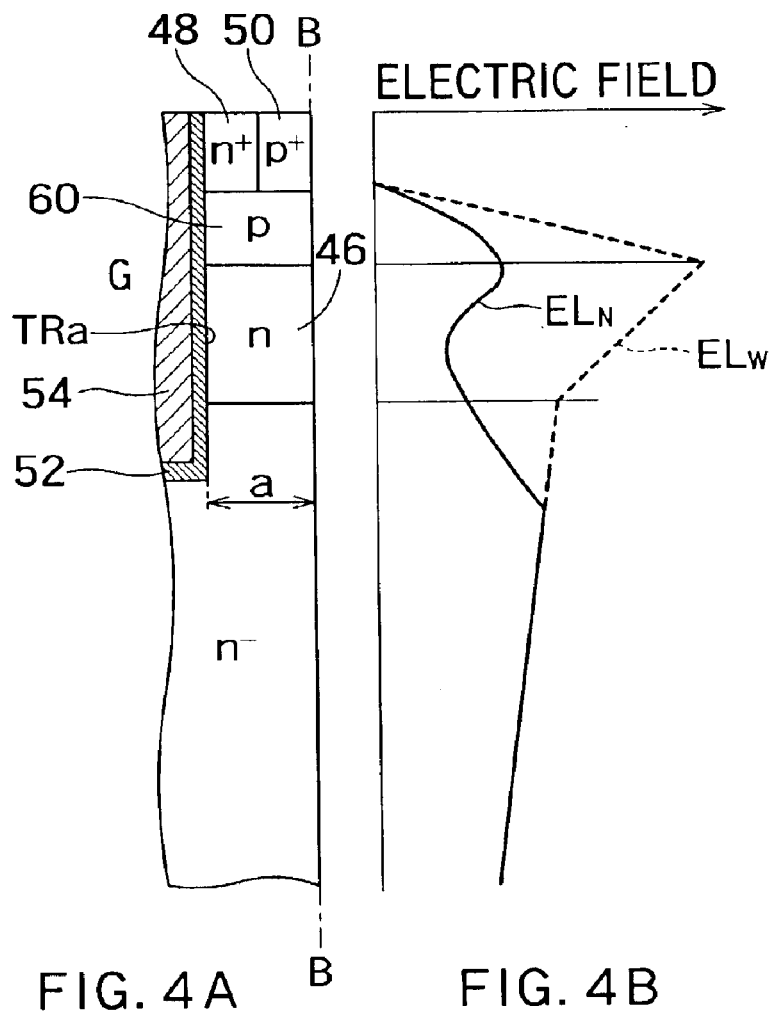
FIGS. 4A and 4B are explanatory views showing a reason why the breakdown voltage of a device does not drop, when a width of an active region is decreased but even when a density of an n-type barrier layer is increased.
FIG. 5 is a table showing a capability of the IGBT shown in FIG. 3 in comparison with that of the IGBT according to a related art.

With regard to the IGBT 4 of the embodiment, when the width of the active region is reduced, the breakdown voltage of the device does not drop even when the density N of the n-type barrier layer 46 is raised. A reason for this will be described with reference to FIGS. 4A and 4B. FIG. 4A is a partial sectional view along line B—B of FIG. 3. FIG. 4B is an electric field distribution diagram along line B—B of FIG. 3. When the amount a the half of the interval between the trenches TRa is large, as shown by a broken line $EL_W$ of FIG. 4B, an electric field takes a peak value in the pn-junction between the p-type well layer 60 and the n-type barrier layer 46. On the other hand, when the amount a the half of the interval between the trenches TRa is reduced to deplete the n-type barrier layer 46, as shown by a solid line $EL_N$ of FIG. 4B, the peak value of the electric field moves to bottom portions of the trenches TRa. Therefore, even when the concentration of the n-type barrier layer 46 is raised, the breakdown voltage does not drop.

Other advantages of the IGBT 4 of the present embodiment will be described with reference to FIG. 5. FIG. 5 is a table showing a capability of the IGBT 4 based on an experiment result in comparison with that of the IGBT according to a related art. It is to be noted that in the figure Qn represents a total sum of an impurity concentration in an n-type impurity region between the trenches TRa.

As shown in Example 1 in upper second line of the table in FIG. 5, when Qn is increased in the IGBT 4 of the present embodiment, an on-voltage lowers as compared with a structure example according to the related art. However, when the amount a the half of the trench interval remains to be large (a=2 μm) in the same manner as in the related art, the breakdown voltage is deteriorated.

On the other hand, when the amount a the half of the trench interval is reduced (a=1 μm) in Examples 2 and 3 of the IGBT 4 of the present embodiment, even with the large Qn, the on-voltage can be lowered without deteriorating the breakdown voltage. This has also revealed that the amount a the half of the width of the active region and the total sum Qn of the impurity densities of the n-type impurity layers in the active region are preferably in the following range.

$$a \leq 1 \ \mu m \ \text{and/or} \ Qn \geq 2 \times 10^{12} \ cm^{-2} \qquad \text{Equation (2)}$$

(3) Third Embodiment

Figure 6:
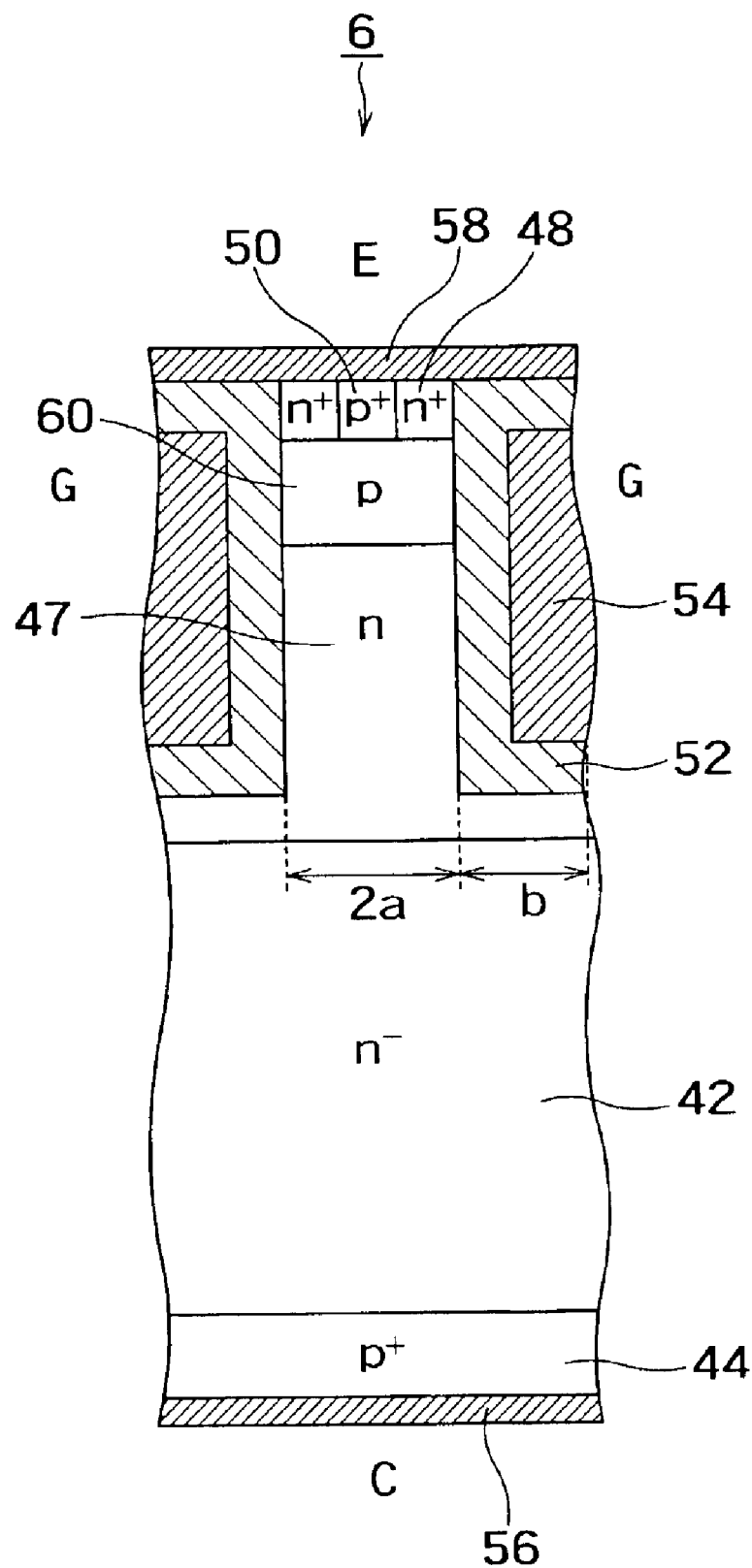
FIG. 6 is a sectional view showing the schematic constitution of a third embodiment of the semiconductor device according to the present invention.

FIG. 6 is a sectional view showing the schematic constitution of a third embodiment of the semiconductor device according to the present invention. The characteristics of an IGBT 6 shown in the figure lie in that an n-type barrier layer 47 in the active region extends to a region deeper than the bottom surface of the trench TRa. The other constitution of the IGBT 6 is substantially the same as that of the IGBT 4 shown in FIG. 3. When the n-type barrier layer 47 is formed so as to extend deeper than the bottom surface of the trench as in the present embodiment, the positive hole is rendered not to flow in an interface portion between the barrier layer 47 and the oxide film 52. The above-described problem that the accumulated amount of the positive holes drops due to the surface recombination can also be solved and the on-resistance can further be reduced.

(4) Fourth Embodiment

Figure 7:
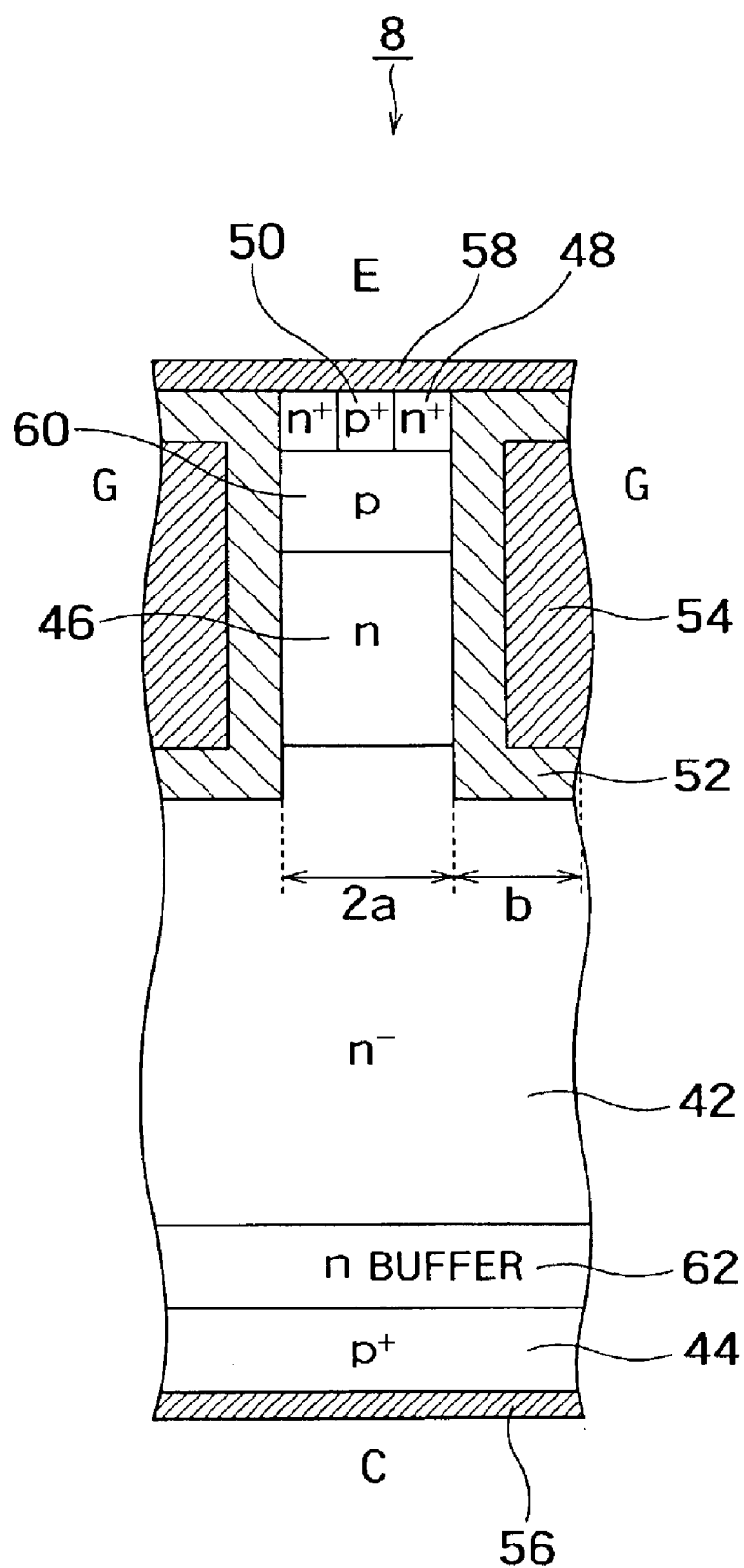
FIG. 7 is a sectional view showing the schematic constitution of a fourth embodiment of the semiconductor device according to the present invention.

FIG. 7 is a sectional view showing the schematic constitution of a fourth embodiment of the semiconductor device according to the present invention. As shown in the figure, the characteristics of an IGBT 8 of the present embodiment lie in that the IGBT further comprises an n-type buffer layer 62 disposed between the n⁻-type base layer 42 and the p⁺-type emitter layer 44. As the n-type buffer layer 62 is thus disposed, the breakdown voltage of the device can be prevented from dropping even when the n⁻-type base layer 42 is thinned in order to lower the on-resistance.

(5) Fifth Embodiment

Figure 8:
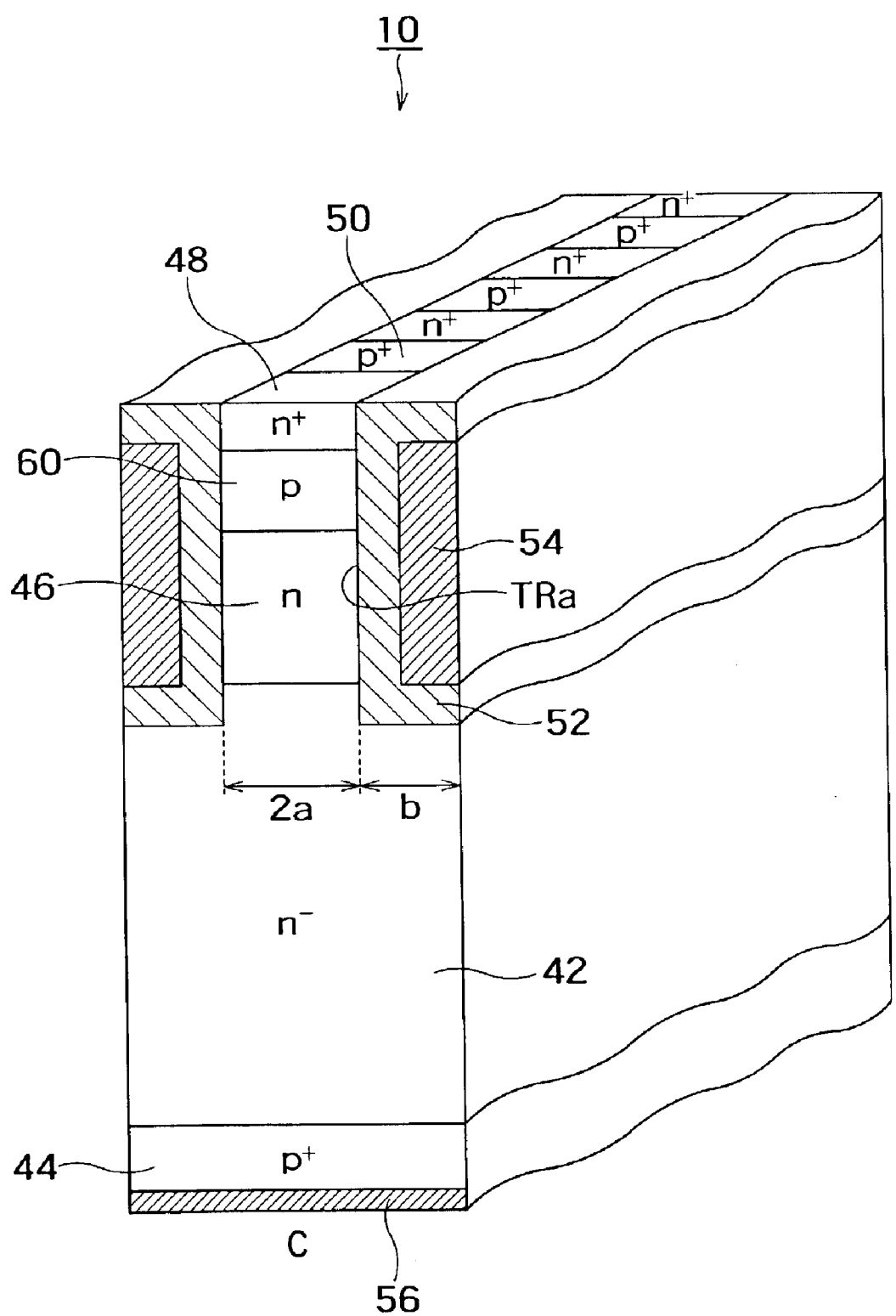
FIG. 8 is a partial perspective view showing the schematic constitution of a fifth embodiment of the semiconductor device according to the present invention.

FIG. 8 is a partial perspective view showing the schematic constitution of a fifth embodiment of the semiconductor device according to the present invention. The characteristics of an IGBT 10 shown in the figure lie in that the n⁺-type source layers 48 and the p⁺-type contact layers 50 are alternately disposed in a striped plane shape along the direction of the trench TRa in a region between the trenches TRa in a view. The other constitution of the IGBT 10 is substantially the same as that of the IGBT 4 shown in FIG. 3.

(6) Sixth Embodiment

Figure 9:
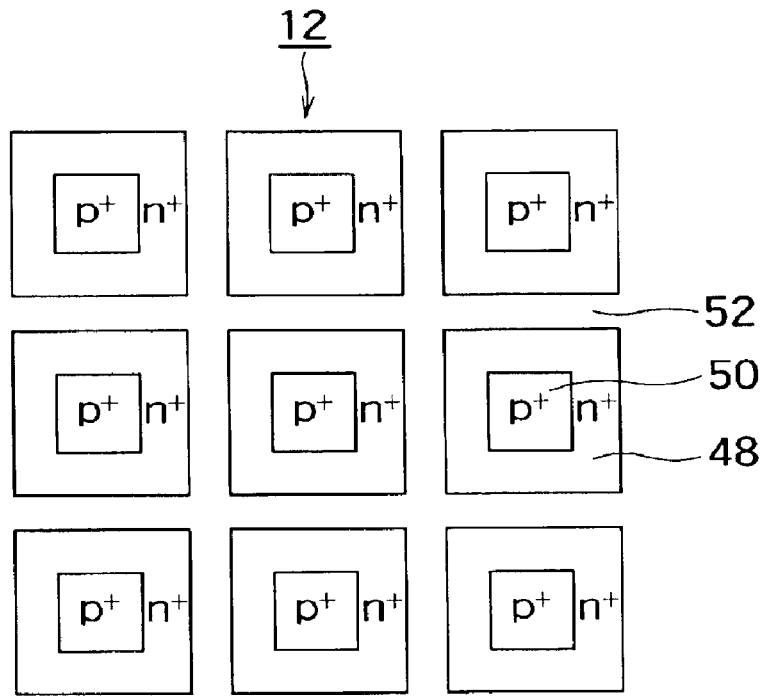
FIG. 9 is a plan view showing a main part of a sixth embodiment of the semiconductor device according to the present invention.

FIG. 9 is a plan view showing a main part of a sixth embodiment of the semiconductor device according to the present invention. In the figure, an emitter electrode is omitted. The characteristics of an IGBT 12 of the present embodiment lie in a cell arrangement of a matrix shape. First, the trenches TRa are disposed so that the gate oxide film 52 forms a lattice shape in the plane view. Next, the n⁺-type source layer 48 is disposed around the p⁺-type contact layer 50 disposed in the middle in each lattice. The other constitution of the IGBT 12 is substantially the same as that of the IGBT 4 shown in FIG. 3.

(7) Seventh Embodiment

Figure 10:
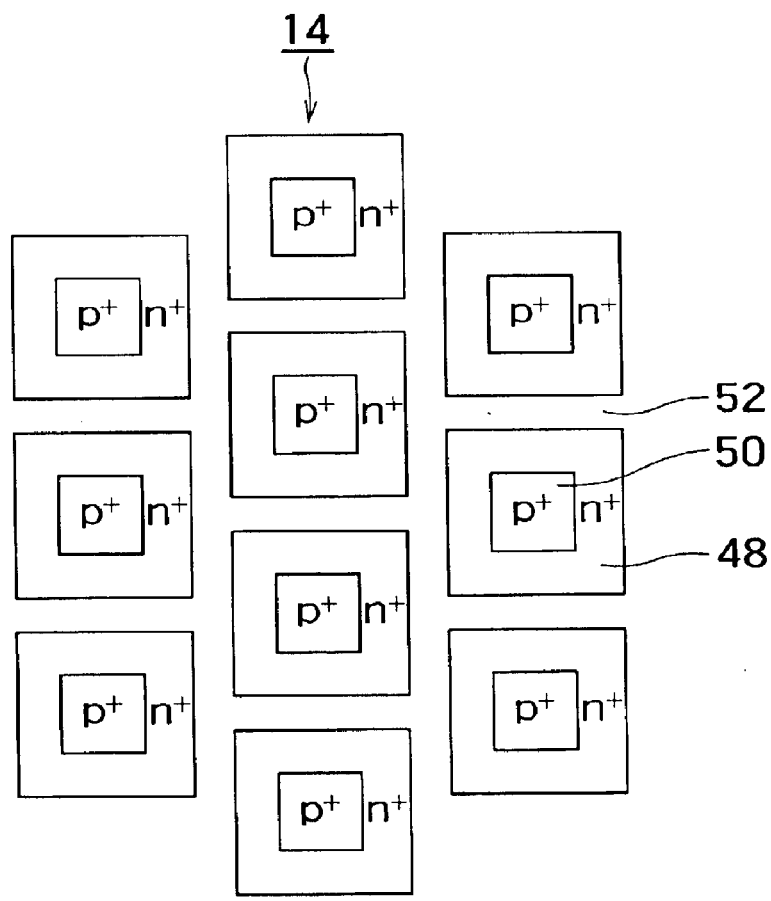
FIG. 10 is a plan view showing the main part of a seventh embodiment of the semiconductor device according to the present invention.

FIG. 10 is a plan view showing the main part of a seventh embodiment of the semiconductor device according to the present invention. Also in this figure, the emitter electrode is omitted. The characteristics of an IGBT 14 of the present embodiment also lie in a mode of the cell arrangement. Assuming that a left/right direction in the sheet of the figure is a row direction and a vertical direction in the sheet of the figure is a column direction, cells are arranged so that columns disposed adjacent to each other alternately shift in the column direction about by a half of a cell pitch of the column direction. In the same manner as in the IGBT 12 of FIG. 9, the p$^+$-type contact layer 50 is disposed in the middle in each lattice, and the n$^+$-type source layer 48 is disposed around the p$^+$-type contact layer 50 in the plane view. The other constitution of the IGBT 14 is substantially the same as that of the IGBT 4 shown in FIG. 3.

(8) Eighth Embodiment

Figure 11:
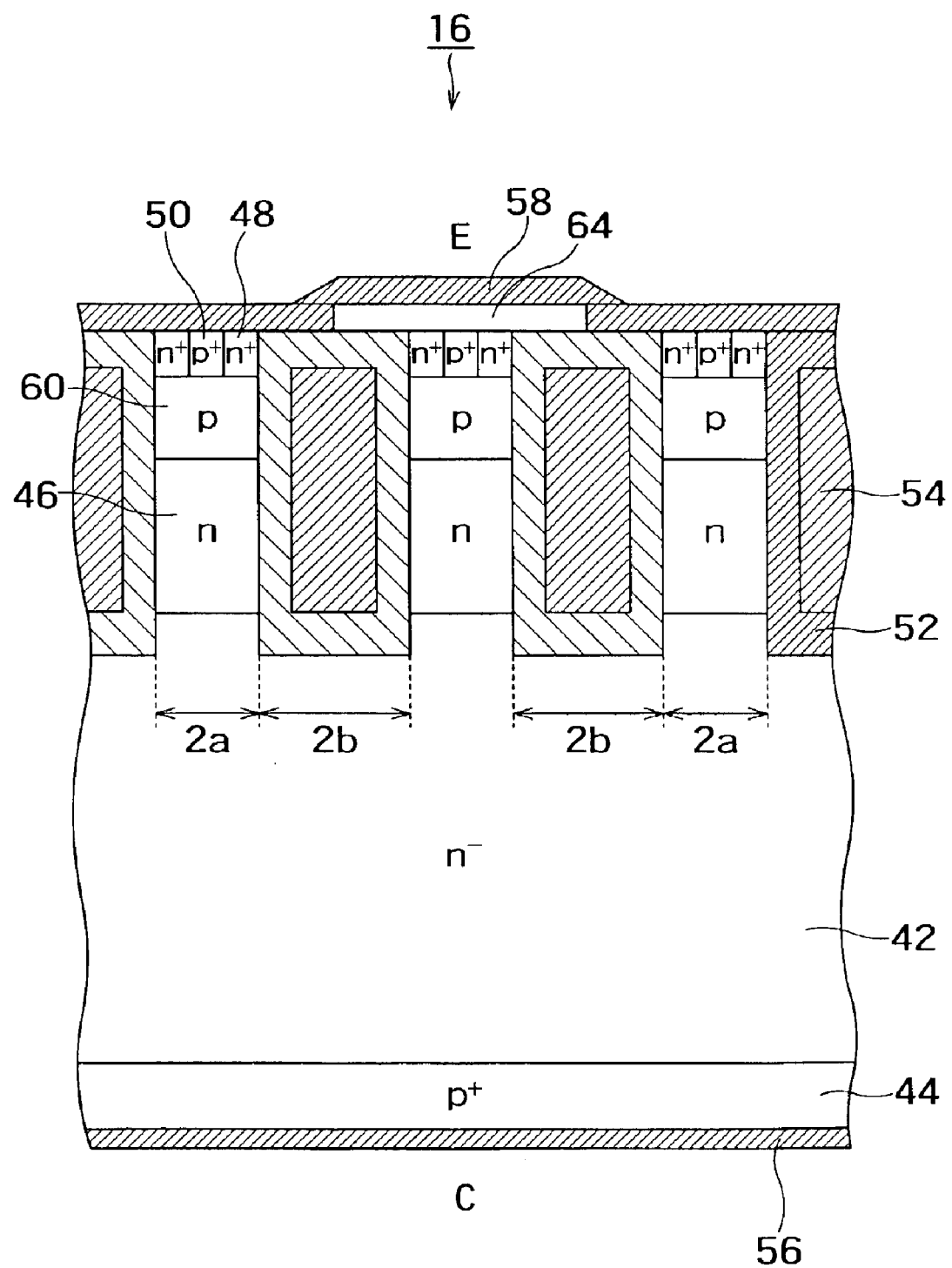
FIG. 11 is a sectional view showing the schematic constitution of an eighth embodiment of the semiconductor device according to the present invention.

FIG. 11 is a sectional view showing the schematic constitution of an eighth embodiment of the semiconductor device according to the present invention. The characteristics of an IGBT 16 shown in the figure lie in that an insulating film 64 is disposed on a surface of a portion (dummy region) which does not contribute to the operation of the device in the region between the trenches TRa to prevent the dummy region from contacting the emitter electrode. Therefore, an emitter electrode 58 is formed from the region of the p$^+$-type contact layer 50 in a portion of a function cell (active region) to a region on the gate oxide films 52 sandwiching the active regions through the region of the n$^+$-type source layers 48. Furthermore, the emitter electrode is also formed so as to cover the insulating film 64 so that emitter contacts of the function cells disposed adjacent to each other are connected to each other. When a channel region is thinned in this manner, the on-voltage of the device further drops. It is to be noted that in the present embodiment the dummy region includes a structure similar to that of the active region. However, the structure of the dummy region is not limited to this, and may also be the n-type barrier layer 46 as such or may also include a structure only of p-layers as long as contact with the emitter electrode is interrupted.

(9) Ninth Embodiment

Figure 12:
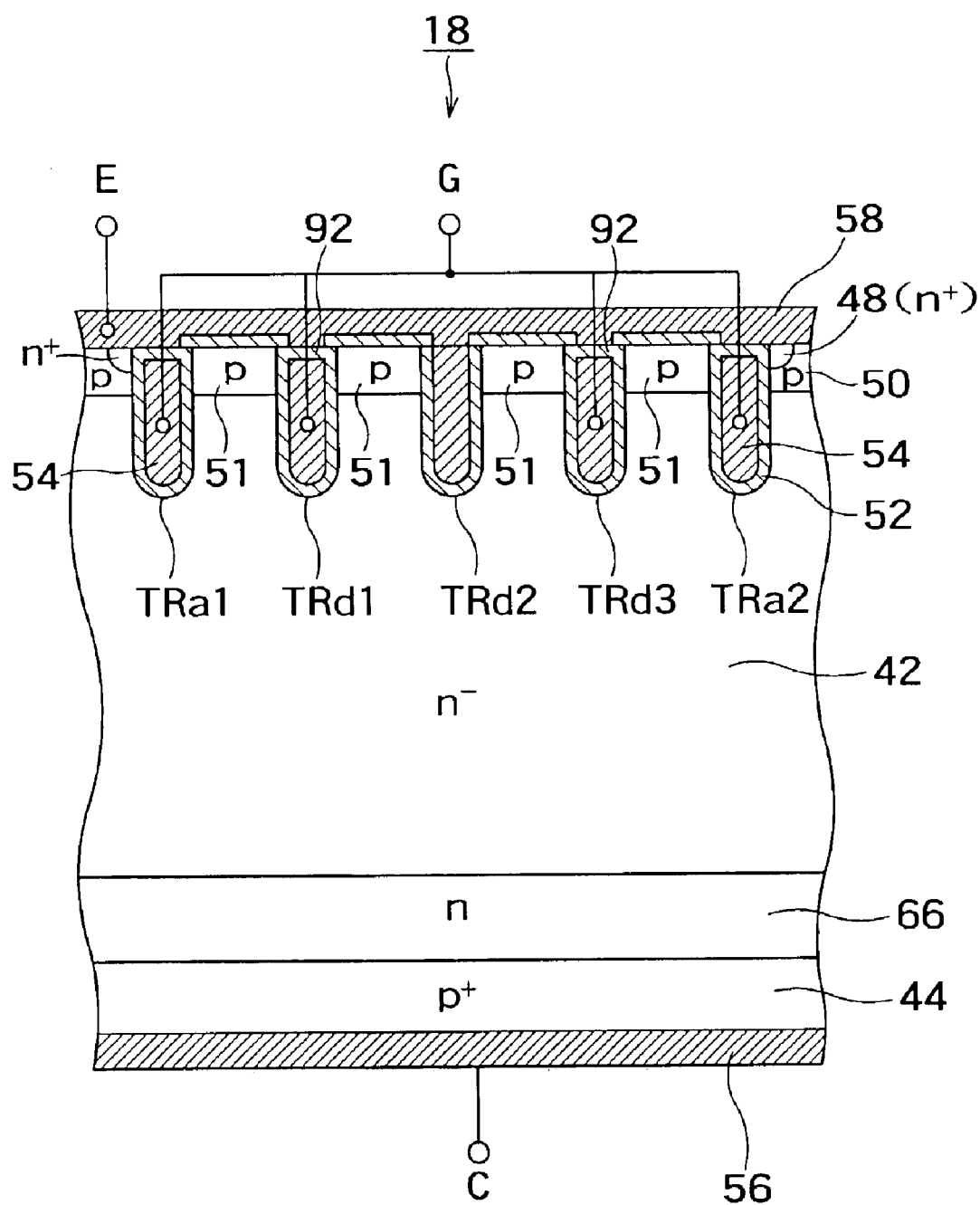
FIG. 12 is a sectional view showing the schematic constitution of a ninth embodiment of the semiconductor device according to the present invention.
Figure 28:
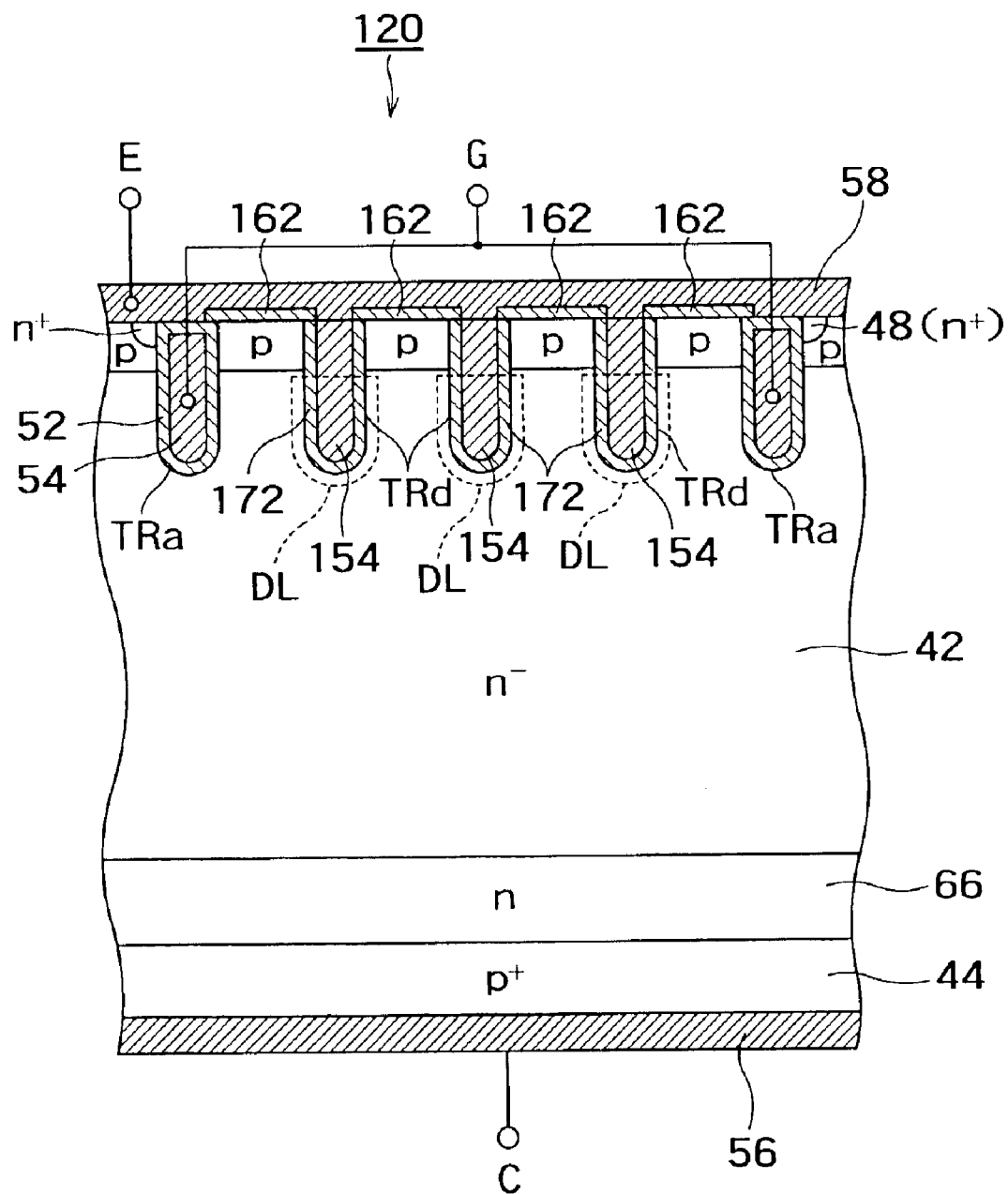
FIG. 28 is a schematic sectional view showing another example of the IGBT according to the related art.

FIG. 12 is a sectional view showing the schematic constitution of a ninth embodiment of the semiconductor device according to the present invention. As apparent from the comparison with FIG. 28, the characteristics of an IGBT 18 shown in the figure lie in that, of dummy trenches TRd1 through TRd3, electrodes in dummy trenches TRd1 and TRd3 positioned adjacent to active trenches TRa1, TRa2 contacting a current path, respectively, are connected to a gate electrode G. The width of the active region held between the active trenches is about 2 $\mu$m or less in the same manner as in the first embodiment. The other constitution of the IGBT 18 is substantially the same as that of the IGBT 120 shown in FIG. 28.

According to the IGBT 18 of the present embodiment, in the on-state of the device, the gate electrode G is biased in the positive direction with respect to the voltage of the emitter electrode 58 by this constitution. Therefore, electrons are accumulated in the interfaces between the gate oxide films 52 of the dummy trenches TRd1, TRd3 and the n$^-$-type base layers 42. The carriers in the surfaces of the dummy trenches TRd1 and TRd3 can be prevented from being recombined, and the carrier density in the n$^-$-type baselayer 42 can be raised. As a result, conductivity loss of the IGBT 18 is reduced.

(10) Tenth Embodiment

Figure 13:
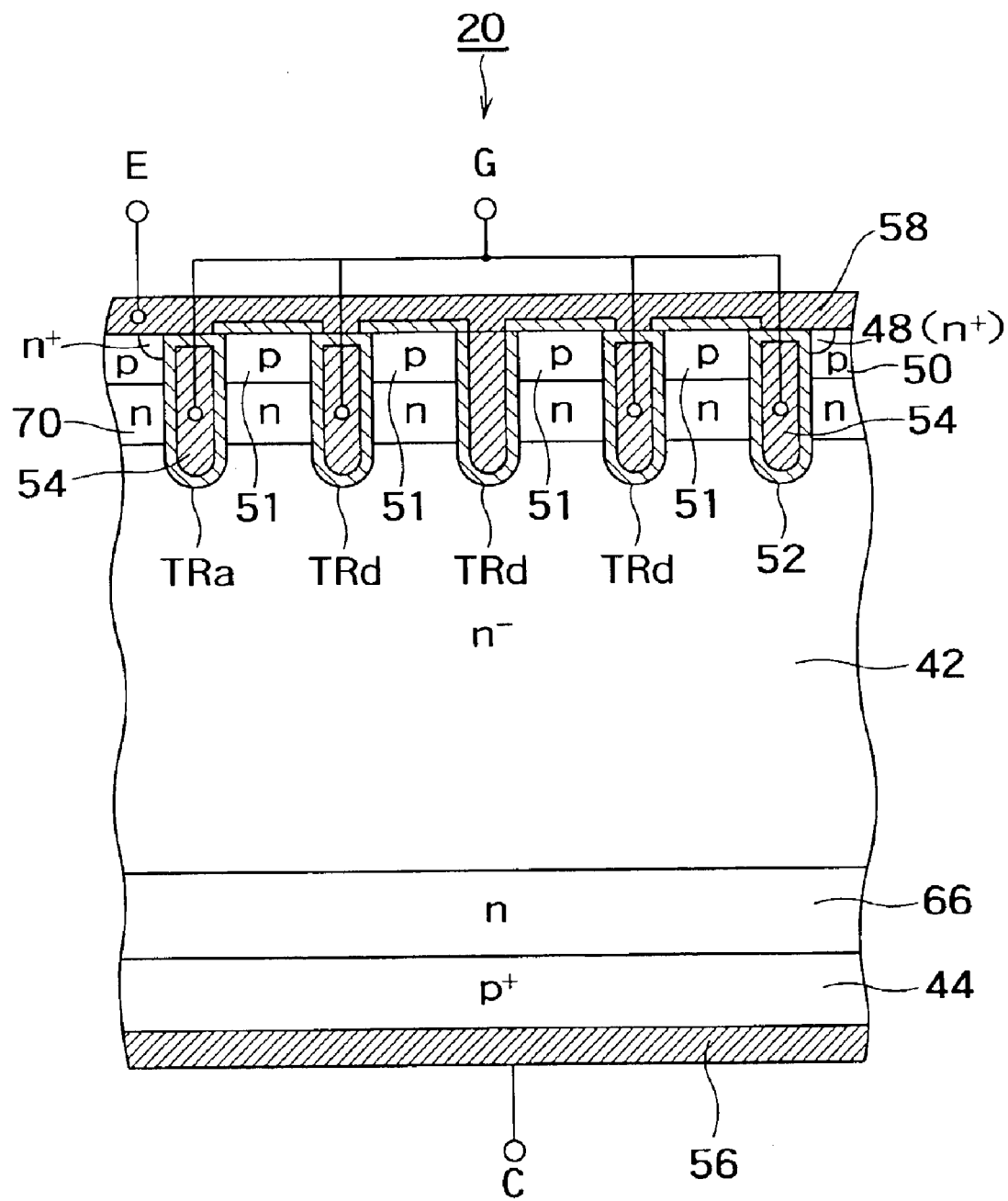
FIG. 13 is a sectional view showing the schematic constitution of a tenth eighth embodiment of the semiconductor device according to the present invention.

FIG. 13 is a sectional view showing the schematic constitution of a tenth eighth embodiment of the semiconductor device according to the present invention. An IGBT 20 shown in the figure is different from the IGBT 18 shown in FIG. 12 in that an n-type barrier layer 70 is disposed so as to be inserted between the p$^+$-type contact layer 50 and p-type well layer 51, and the n$^-$-type base layer 42. When the n-type barrier layer 70 is inserted/disposed in this position, resistance further increases in discharging the positive hole to the emitter electrode 58 from the n$^-$-type base layer 42. As a result, since the accumulated amount of the positive hole can be increased, the conductive loss can further be reduced. Even in the present embodiment, the impurity concentration of the n-type barrier layer 70 is higher than that of the n$^-$-type base layer 42 at least in the vicinity of the interface between the n-type barrier layer 70 and the n$^-$-type base layer 42. Furthermore, in the IGBT 20 of the present embodiment, in order to prevent the breakdown voltage from being deteriorated, each distance between the trenches is preferably 2 $\mu$m or less as described in the second embodiment.

Figure 14:
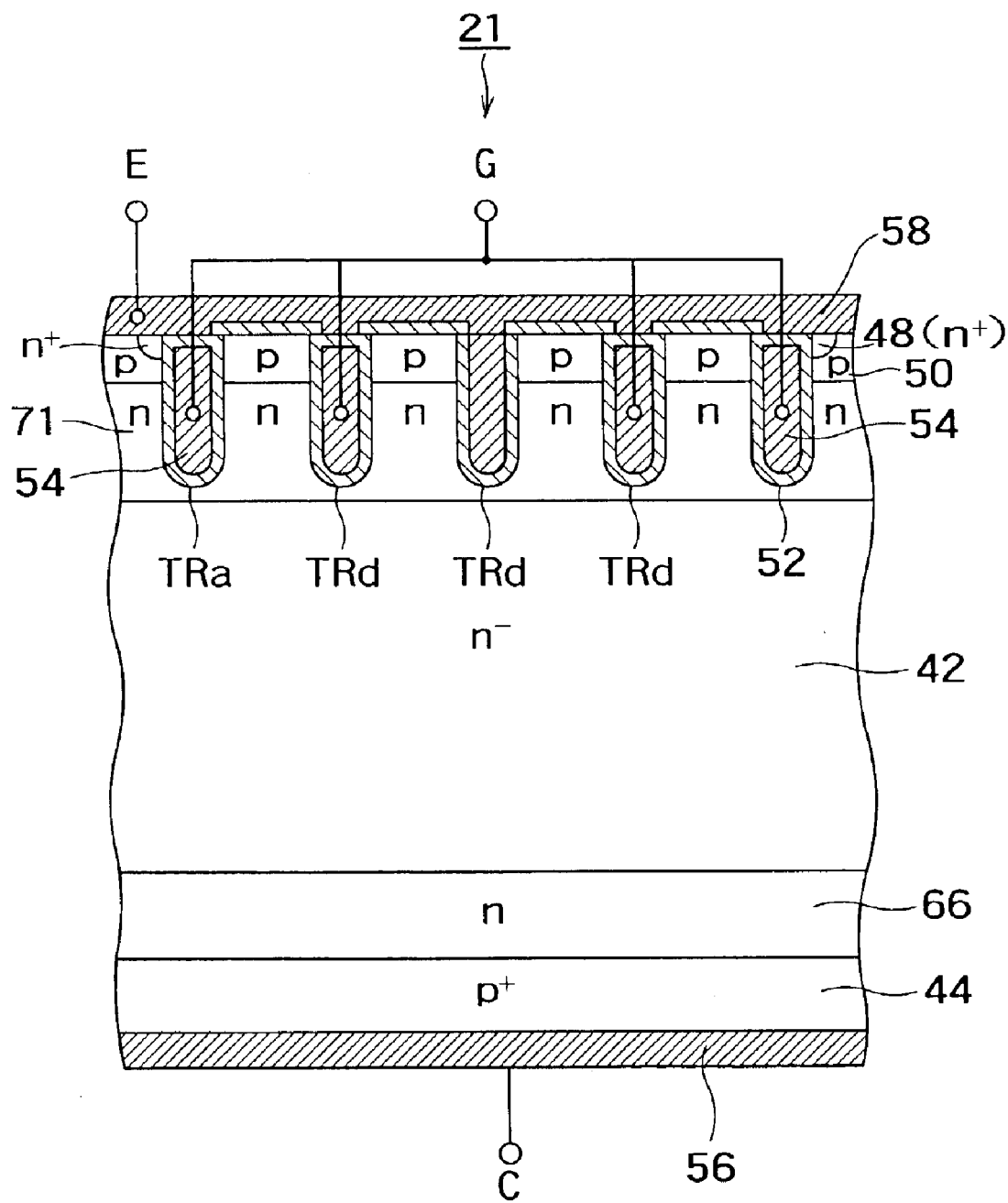
FIG. 14 is a schematic sectional view showing a modification example of the semiconductor device shown in FIG. 13.

A modification example of the present embodiment is shown in FIG. 14. As apparent from the comparison with the IGBT 20 shown in FIG. 13, an IGBT 21 shown in FIG. 14 comprises an n-type barrier layer 71 formed to reach the region deeper than the bottom surfaces of the trenches TRa, TRd. By forming the n-type barrier layer 71 so that the bottom surface thereof is deeper than that of the trench in this manner, the positive hole does not flow in the interface portion with the oxide film, as is described in the above third embodiment. The problem that the accumulated amount of the positive holes drops by the surface recombination can also be solved and the on-resistance can further be reduced.

(11) Eleventh Embodiment

Figure 15:
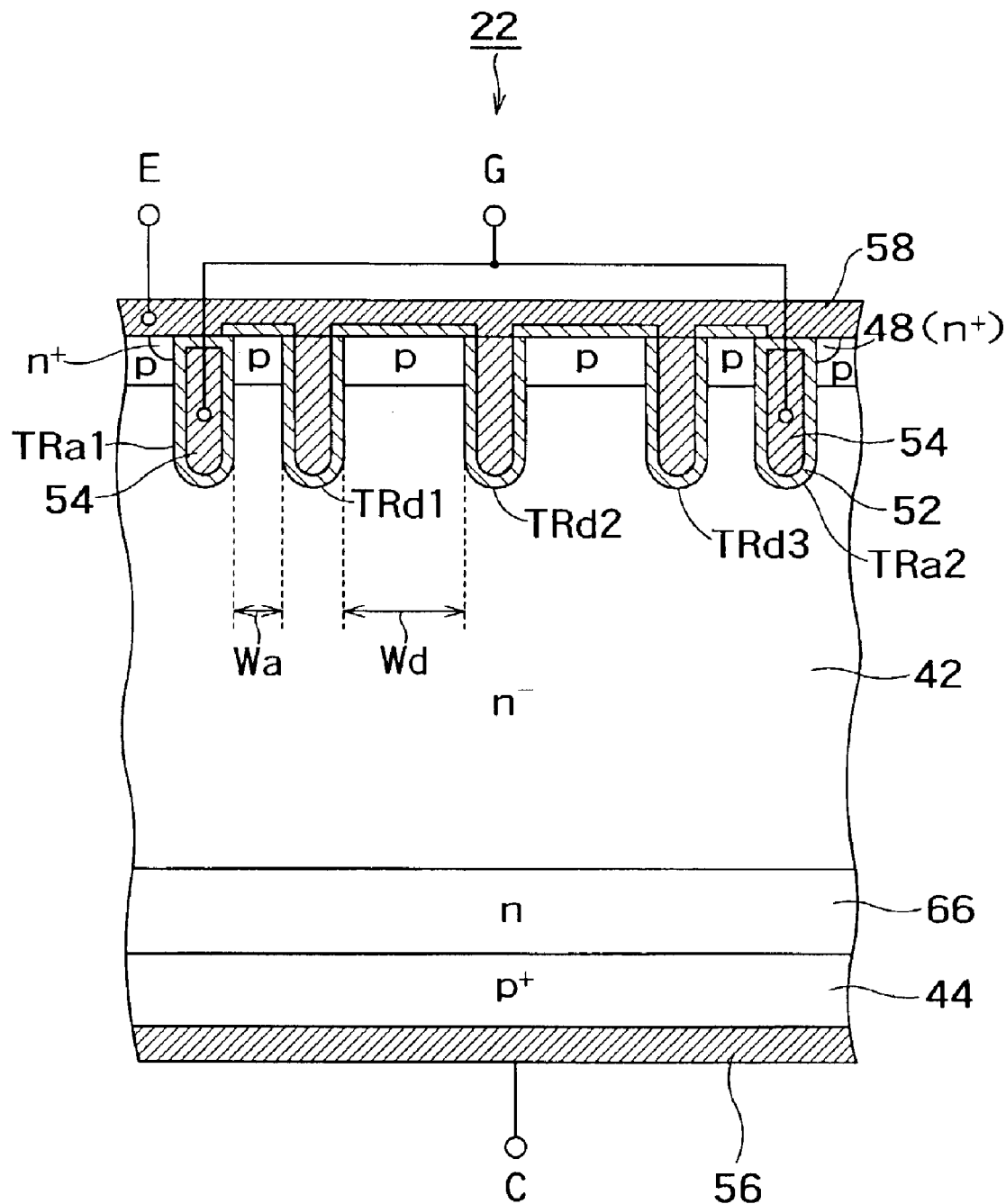
FIG. 15 is a sectional view showing the schematic constitution of an eleventh embodiment of the semiconductor device according to the present invention.

FIG. 15 is a sectional view showing the schematic constitution of an eleventh embodiment of the semiconductor device according to the present invention. As apparent from the comparison with FIG. 28, the characteristics of an IGBT 22 shown in the figure lie in that, in the dummy trenches TRd1 to TRd3 which do not contact the current passage, the distance Wa between the active trench TRa1 (or TRa2) contacting the current path, and the dummy trench TRd1 (or TRd3) positioned adjacent to the active trench TRa1 (or TRa2) is set to be shorter than the distance Wd between the dummy trenches TRd1 and TRd2 (or between TRd3 and TRd2) not contacting the current path.

When the distance between the trenches is shortened, the electric field of the region between the trenches is weakened. Therefore, the carriers accumulated in the n$^-$-type base layer 42 do not easily reach the side walls of the trenches TRa1, TRa2, TRd1, and TRd3. This can prevent the carrier recombination in the surfaces of the trenches TRa1, TRa2, TRd1, and TRd3, and the carrier concentration in the n$^-$-type base layer 42 can be raised. As a result, the conductivity loss of the IGBT 22 is reduced.

Moreover, the gate-collector capacitance is reduced, thereby controllability of the IGBT 22 at the turn-on period is enhanced and stability at the turn-off period is further enhanced.

(12) Twelfth Embodiment

Figure 16:
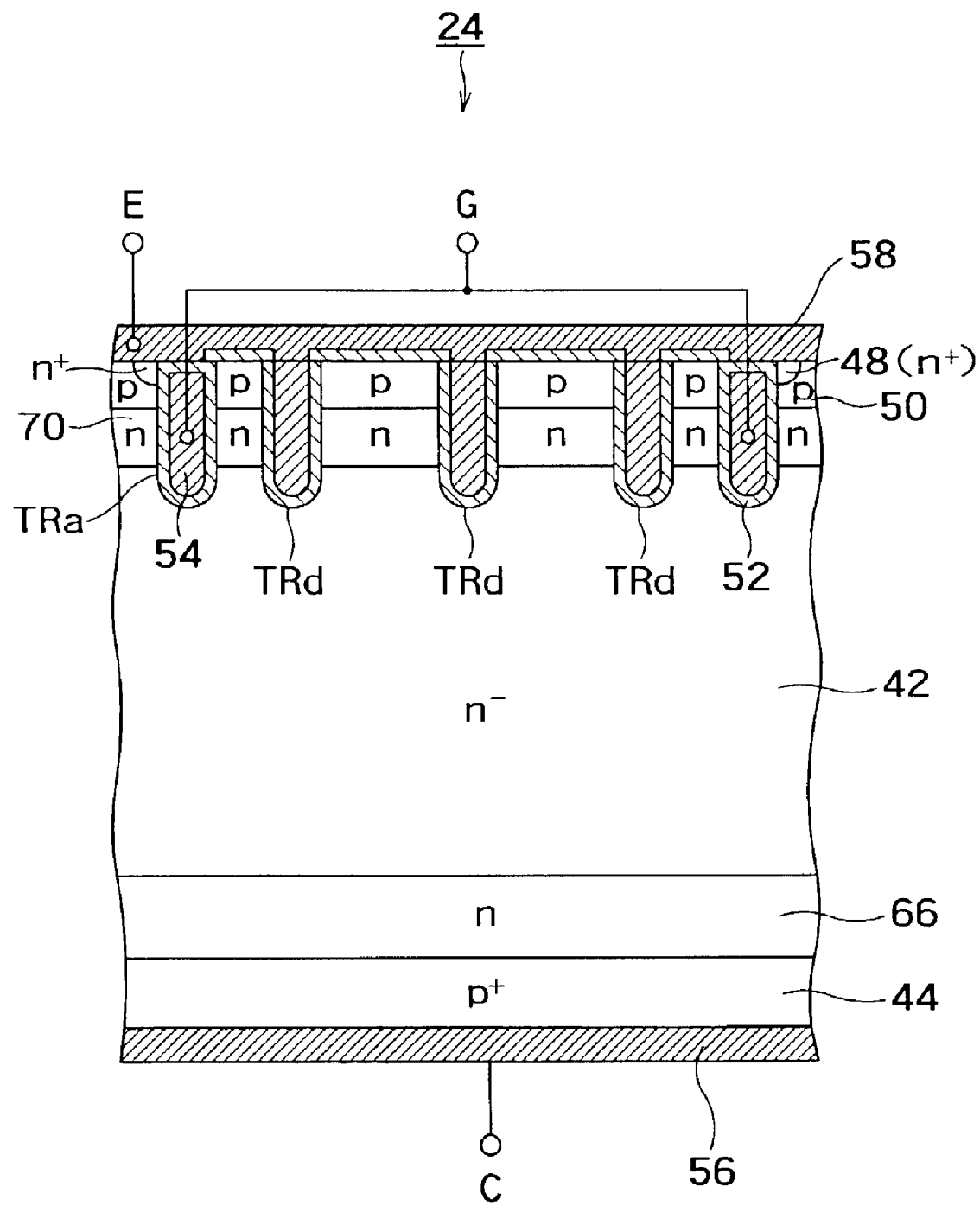
FIG. 16 is a sectional view showing the schematic constitution of a twelfth embodiment of the semiconductor device according to the present invention.

FIG. 16 is a sectional view showing the schematic constitution of a twelfth embodiment of the semiconductor device according to the present invention. An IGBT 24 shown in the figure is different from the IGBT 22 shown in FIG. 15 in that the n-type barrier layer 70 is inserted/disposed between the n$^-$-type base layer 42 and the p-type contact layer 50. When the n-type barrier layer 70 is inserted/disposed in this manner, the resistance further increases in discharging the positive hole to the emitter electrode 58 from the n$^-$-type base layer 42. As a result, since the accumulated amount of the positive holes can be increased, the-conductive loss can further be reduced. Also in the present embodiment, the impurity concentration of the n-type barrier layer 70 is higher than that of the n⁻-type base layer 42 at least in the vicinity of the interface between the n-type barrier layer 70 and the n⁻-type base layer 42. Furthermore, in the IGBT 24 of the present embodiment, in order to prevent the breakdown voltage from being deteriorated, the distance between the active trenches is preferably 2 μm or less as is described in the second embodiment.

Figure 17:
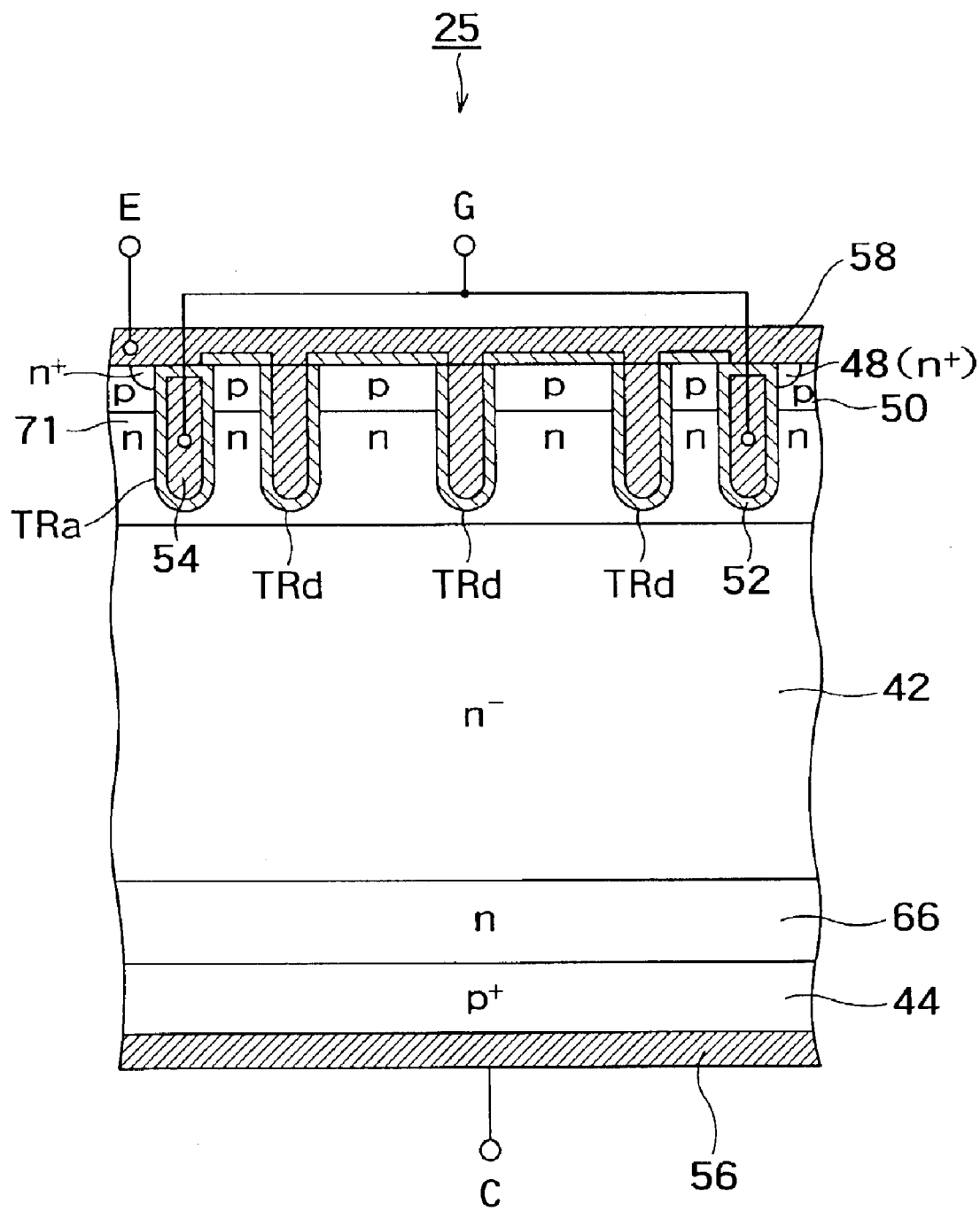
FIG. 17 is a schematic sectional view showing a modification example of the semiconductor device shown in FIG. 16.

A modification example of the present embodiment is shown in FIG. 17. As apparent from the comparison with the IGBT 24 shown in FIG. 16, an IGBT 25 shown in FIG. 17 comprises the n-type barrier layer 71 formed to reach the region deeper than the bottom surfaces of trenches TRa, TRd. Since the n-type barrier layer is thus formed so that the bottom surface thereof is deeper than that of the trench, the positive hole does not flow in the interface portion with the oxide film. The problem that the accumulated amount of the positive holes drops by the surface recombination can also be solved and the on-resistance can further be reduced, as is described above in the third embodiment.

(13) Thirteenth Embodiment

Figure 18:
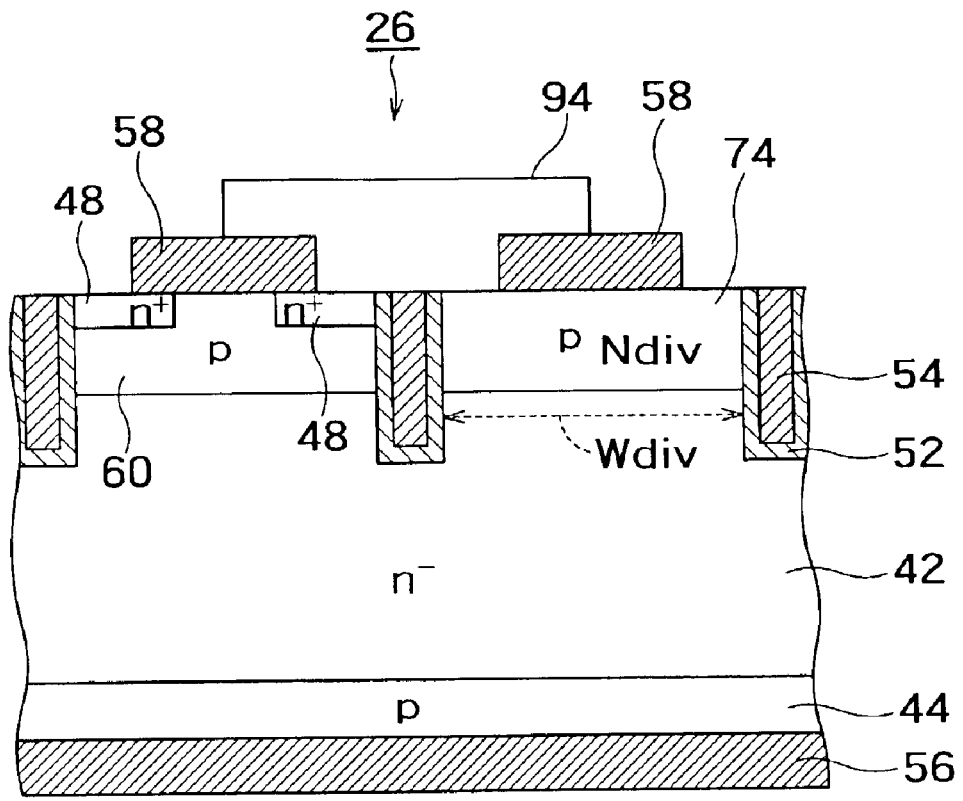
FIG. 18 is a sectional view showing the schematic constitution of a thirteenth embodiment of the semiconductor device according to the present invention.
Figure 19:
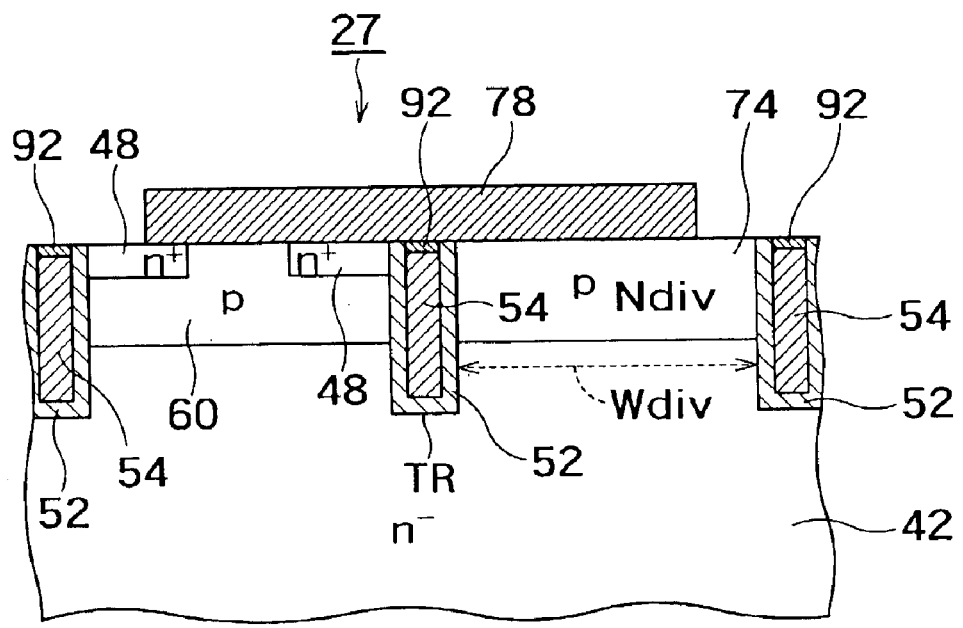
FIG. 19 is a schematic sectional view showing a modification example of the semiconductor device shown in FIG. 18.

FIG. 18 is a sectional view showing the schematic constitution of a thirteenth embodiment of the semiconductor device according to the present invention. An IGBT 26 shown in the figure is different from the IGBT 10 shown in FIG. 27 in that the IGBT 26 further comprises a p-type diverter layer 74 which is disposed in a surface portion of the device on an emitter side and in which the electrons are not injected. The emitter electrode 58 is also disposed on the p-type diverter layer 74, and the p-type diverter layer 74 is directly connected to the emitter electrode 58. It is to be noted that in the present embodiment the emitter electrode 58 contacting the n⁺-type source layer 48 is connected to the emitter electrode 58 contacting the p-type diverter layer 74 by a wiring 94. However, in the present invention, the arrangement of the emitter electrode is not limited to that in this embodiment. For example, as in an IGBT 27 shown in FIG. 19, an emitter electrode 78 is continuously formed to extend to the surface of the p-type diverter layer 74 from the surface of the n⁺-type source layer 48 via the region on an insulating film 92 of the trench disposed adjacent to the p-type diverter layer 74, thereby the wiring 94 can be omitted. Such constitution of the emitter electrode is in common applicable to the devices in fourteenth through eighteenth embodiments described later.

The p-type diverter layer 74 disposed in this manner enhances the destruction tolerance of the device since the positive hole is discharged from the p-type diverter layer 74 at the turn-off. However, in an on-state, there is a problem that the on-resistance rises because the positive hole is not sufficiently accumulated due to the presence of the p-type diverter layer 74. To solve the problem, a structure has been proposed in which a resistor or a diode is inserted between the emitter electrode 58 and the p-type diverter layer 74 instead of direct connection of the emitter electrode to the p-type diverter layer (B. J. Baliga, "Trench-IGBTs with Integrated Diverter Structures", Proceedings of 1995 ISPSD, pp. 201, 1995). However, when the emitter electrode 58 is not directly connected to the p-type diverter layer 74 there is also a problem that the destruction tolerance is not enhanced because it is difficult to discharge the positive hole at the turn-off.

Figure 20A:
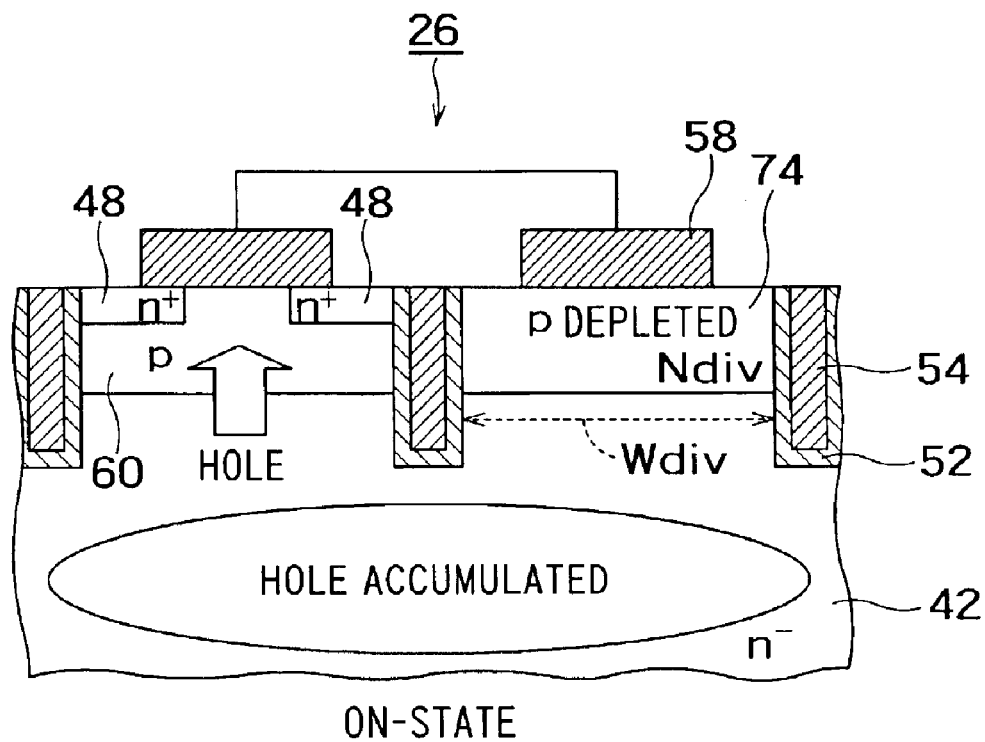
FIGS. 20A and 20B are explanatory views of an operation of the semiconductor device shown in FIG. 18.
Figure 20B:
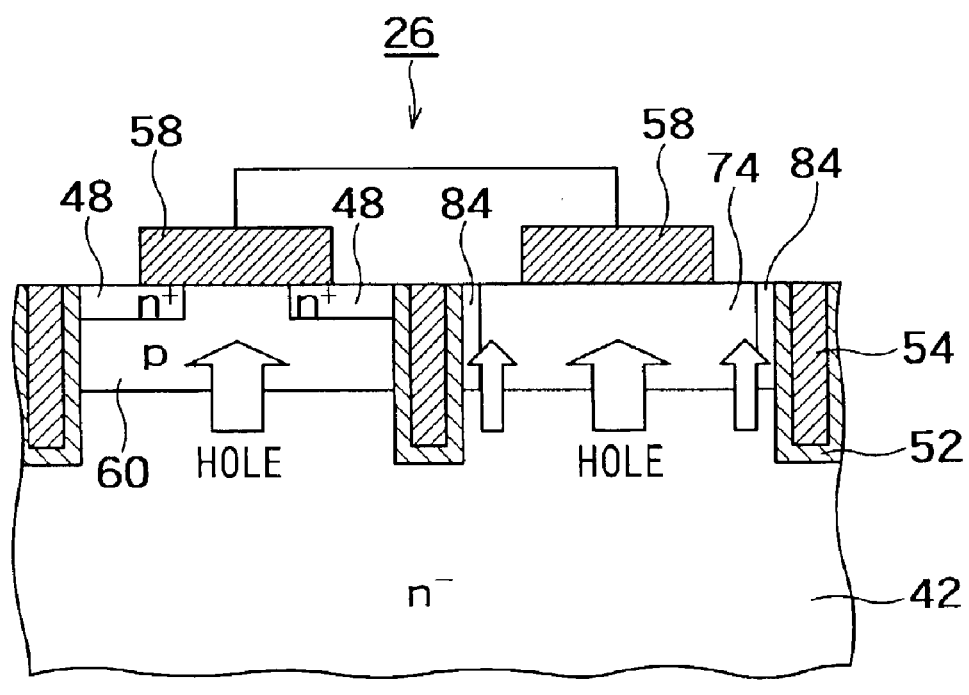

As described above, in the IGBT 26 of the present embodiment, the p-type diverter layer 74 is directly connected to the emitter electrode 58. Therefore, the destruction tolerance at the turn-off is enhanced. On the other hand, the discharge of the positive hole in the on-state can be prevented by applying the gate voltage to deplete the p-type diverter layer 74. This point is explained in more detail with reference to FIGS. 20A and 20B. In the on-state, as shown in FIG. 20A, the p-type diverter layer 74 is depleted since the gate voltage in the positive direction is applied to the emitter electrode 58. When an impurity concentration Ndiv and width Wdiv of the p-type diverter layer 74 are appropriately adjusted to completely deplete the p-type diverter layer 74, the positive hole running toward the emitter electrode 58 is accumulated in the n⁻-type base layer 42 without flowing into the p-type diverter layer 74. Therefore, the on-resistance of the IGBT 26 can be reduced. At the turn-off, as shown in FIG. 20B, the gate voltage in a negative direction is applied to the emitter electrode 58, then a p-type accumulation layer 84 appears in a trench side-wall portion of the p-type diverter layer 74, and the discharge of the positive hole is promoted. As a result, the destruction tolerance of the IGBT 26 is enhanced.

(14) Fourteenth Embodiment

Figure 21:
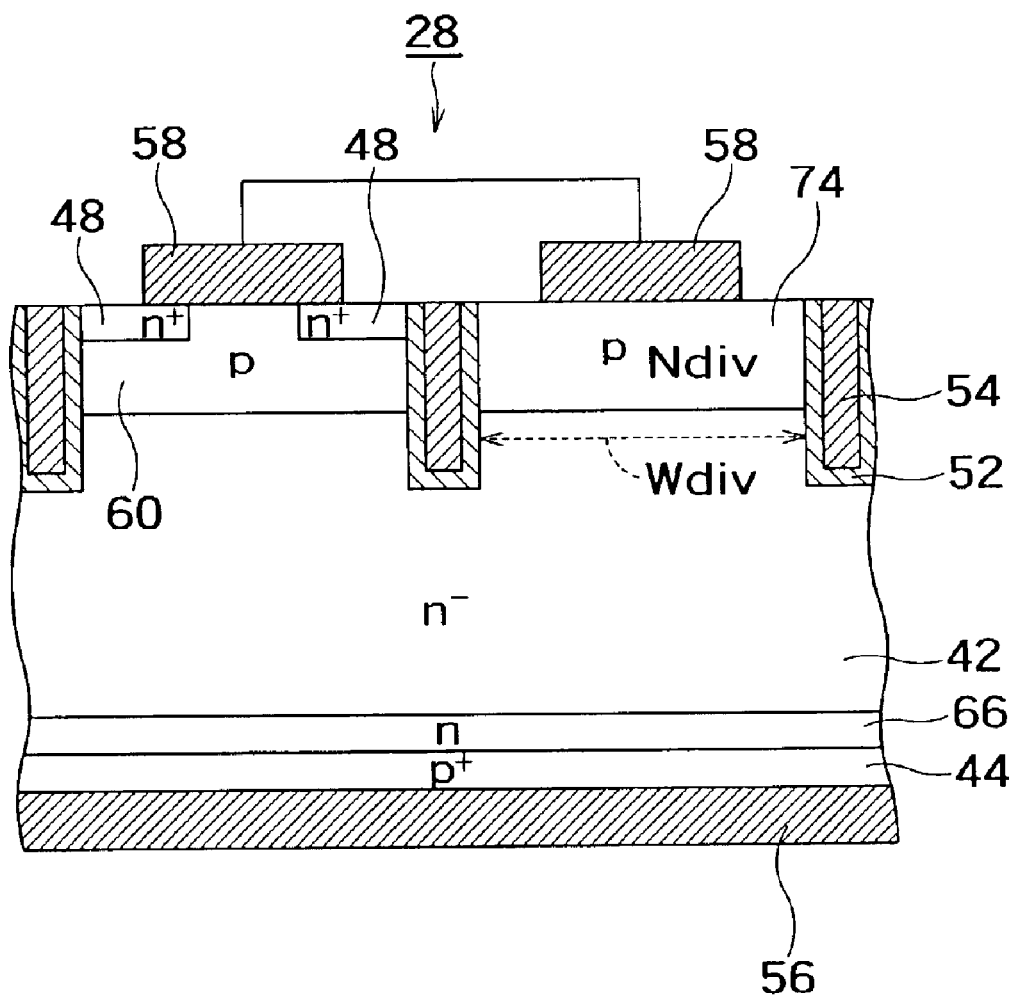
FIG. 21 is a sectional view showing the schematic constitution of a fourteenth embodiment of the semiconductor device according to the present invention.

FIG. 21 is a sectional view showing the schematic constitution of a fourteenth embodiment of the semiconductor device according to the present invention. An IGBT 28 shown in the figure is different from the IGBT 26 shown in FIG. 18 in that the IGBT 28 comprises a punch through structure in which an n-type buffer layer 66 between the p⁺-type emitter layer 44 and the n⁻-type base layer 42 is further included. The other constitution of the IGBT 28 is substantially the same as that of the IGBT 26 shown in FIG. 18.

(15) Fifteenth Embodiment

Figure 22:
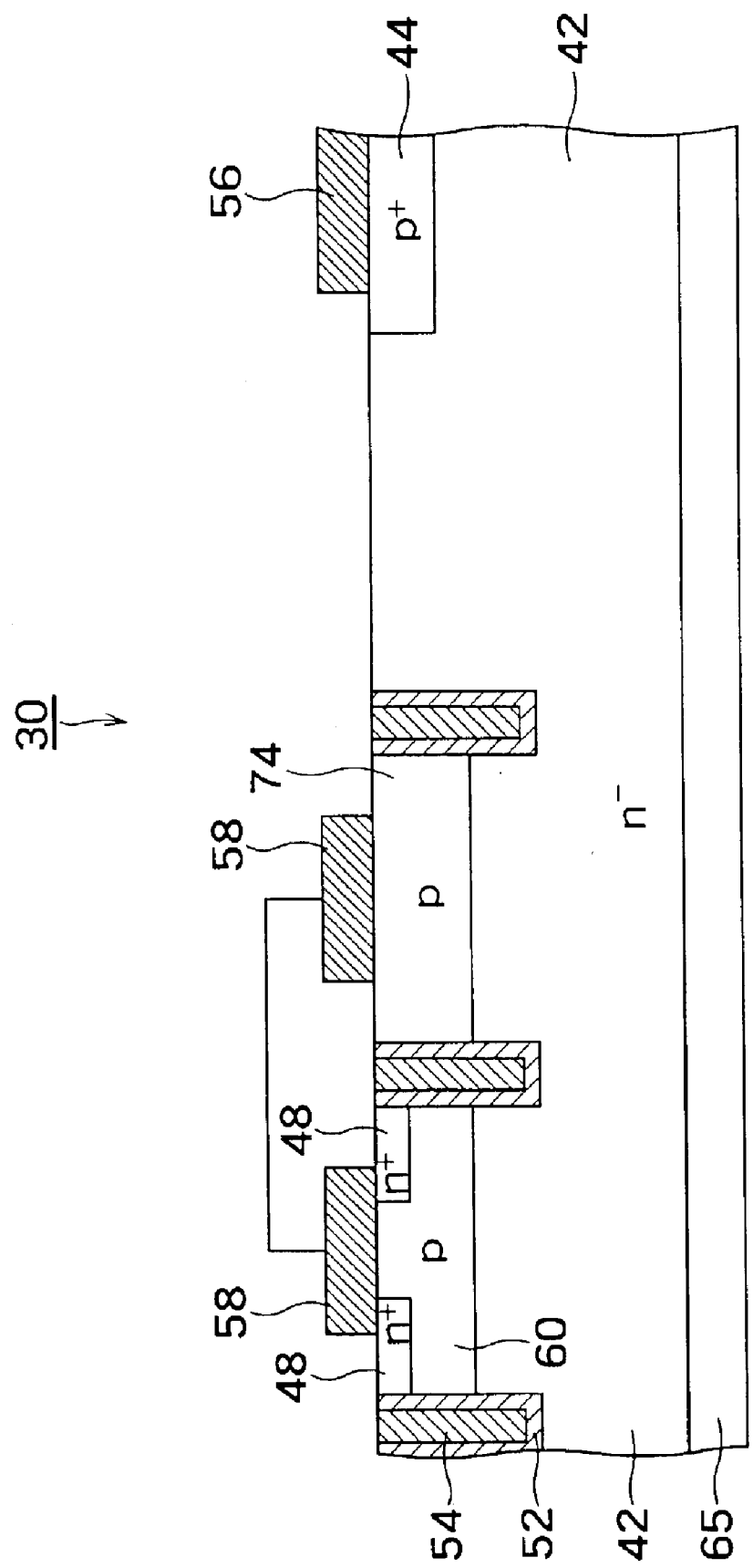
FIG. 22 is a sectional view showing the schematic constitution of a fifteenth embodiment of the semiconductor device according to the present invention.

FIG. 22 is a sectional view showing the schematic constitution of a fifteenth embodiment of the semiconductor device according to the present invention. In an IGBT 30 of the present embodiment, the diverter structure shown in FIG. 18 is realized by a horizontal IGBT. Even in this horizontal structure, the function/effect similar to that of the thirteenth embodiment can be obtained by the p-type diverter layer 74.

(16) Sixteenth Embodiment

Figure 23:
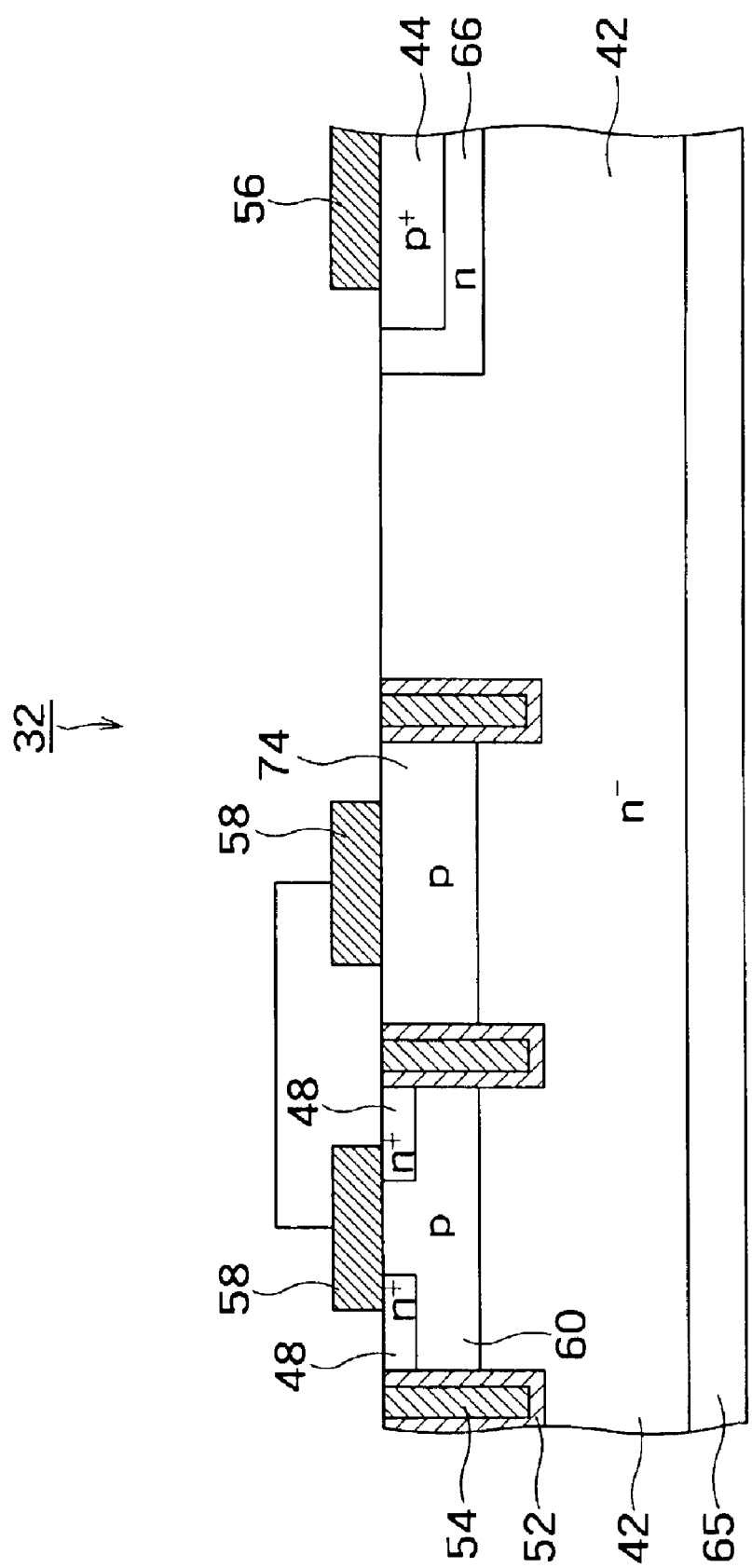
FIG. 23 is a sectional view showing the schematic constitution of a sixteenth embodiment of the semiconductor device according to the present invention.

FIG. 23 is a sectional view showing the schematic constitution of a sixteenth embodiment of the semiconductor device according to the present invention. An IGBT 32 shown in the figure is different from the IGBT 30 shown in FIG. 22 in the punch through structure further including the n-type buffer layer 66 between the p⁺-type emitter layer 44 and n⁻-type base layer 42. The other constitution of the IGBT 32 is substantially the same as that of the IGBT 30 of FIG. 22.

(17) Seventeenth Embodiment

Figure 24:
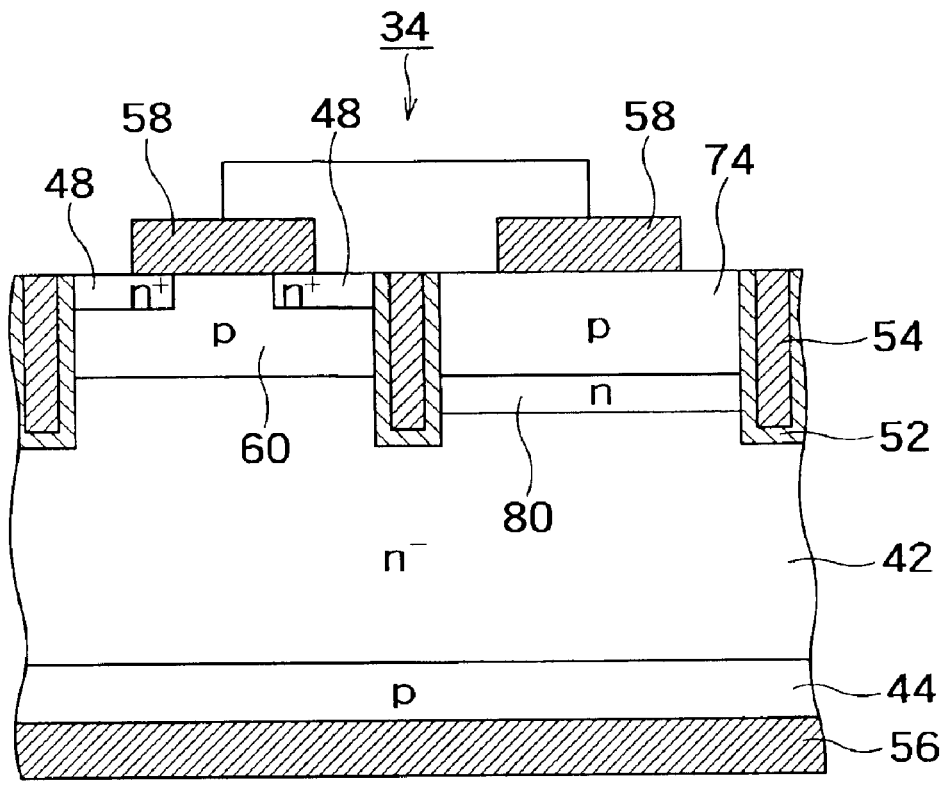
FIG. 24 is a sectional view showing the schematic constitution of a seventeenth embodiment of the semiconductor device according to the present invention.

FIG. 24 is a sectional view showing the schematic constitution of a seventeenth embodiment of the semiconductor device according to the present invention. As apparent from the comparison with FIG. 18, the characteristics of an IGBT 34 of the present embodiment lie in a structure further including an n-type barrier layer 80 disposed between the n⁻-type base layer 42 and the p-type diverter layer 74. This n-type barrier layer 80 further inhibits the positive hole from coming off in the on-state, and an accumulation effect increases. On the other hand, at the turn-off, a p-type inversion layer is formed in the vicinity of a trench side wall of the n-type barrier layer 80. Accordingly, since the discharge resistance of the positive hole lowers, a high destruction tolerance is maintained. It is to be noted that the width of the n-type barrier layer 80 is preferably 2 μm or less as described in the second embodiment.

(18) Eighteenth Embodiment

Figure 25:
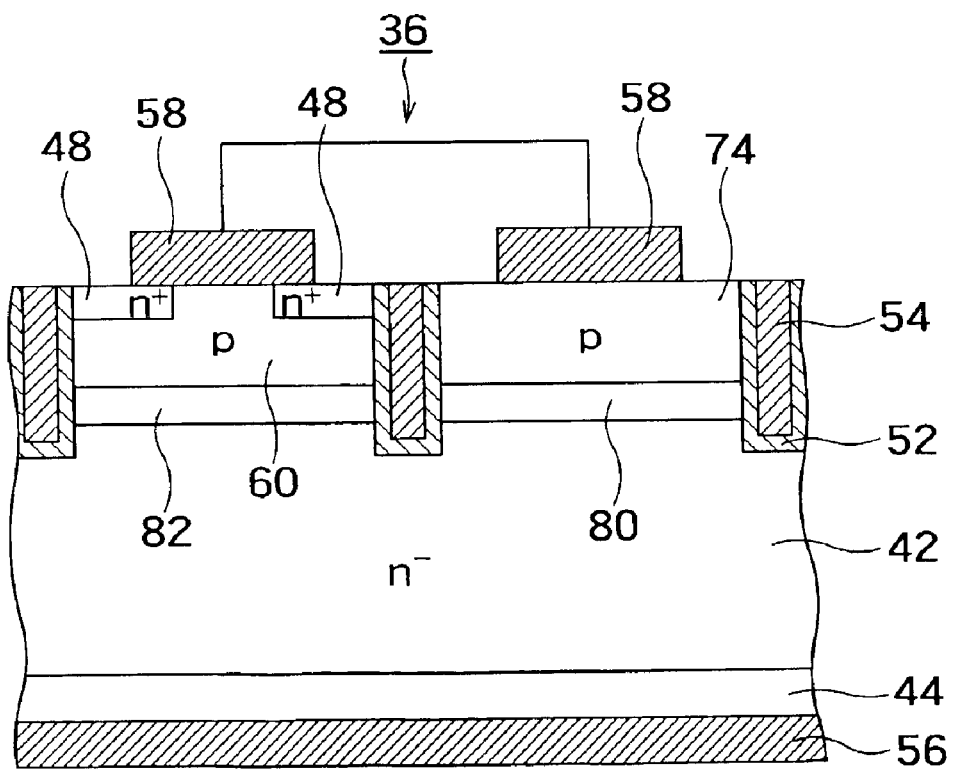
FIG. 25 is a sectional view showing the schematic constitution of an eighteenth embodiment of the semiconductor device according to the present invention.

FIG. 25 is a sectional view showing the schematic constitution of an eighteenth embodiment of the semiconductor device according to the present invention. An IGBT 36 shown in the figure is different from the IGBT 34 shown in FIG. 24 in that an n-type barrier layer 82 is also disposed in the cell including an MOS channel. The n-type barrier layer 82 can further reduce the on-resistance of the IGBT 36.

(19) Nineteenth Embodiment

Figure 26:
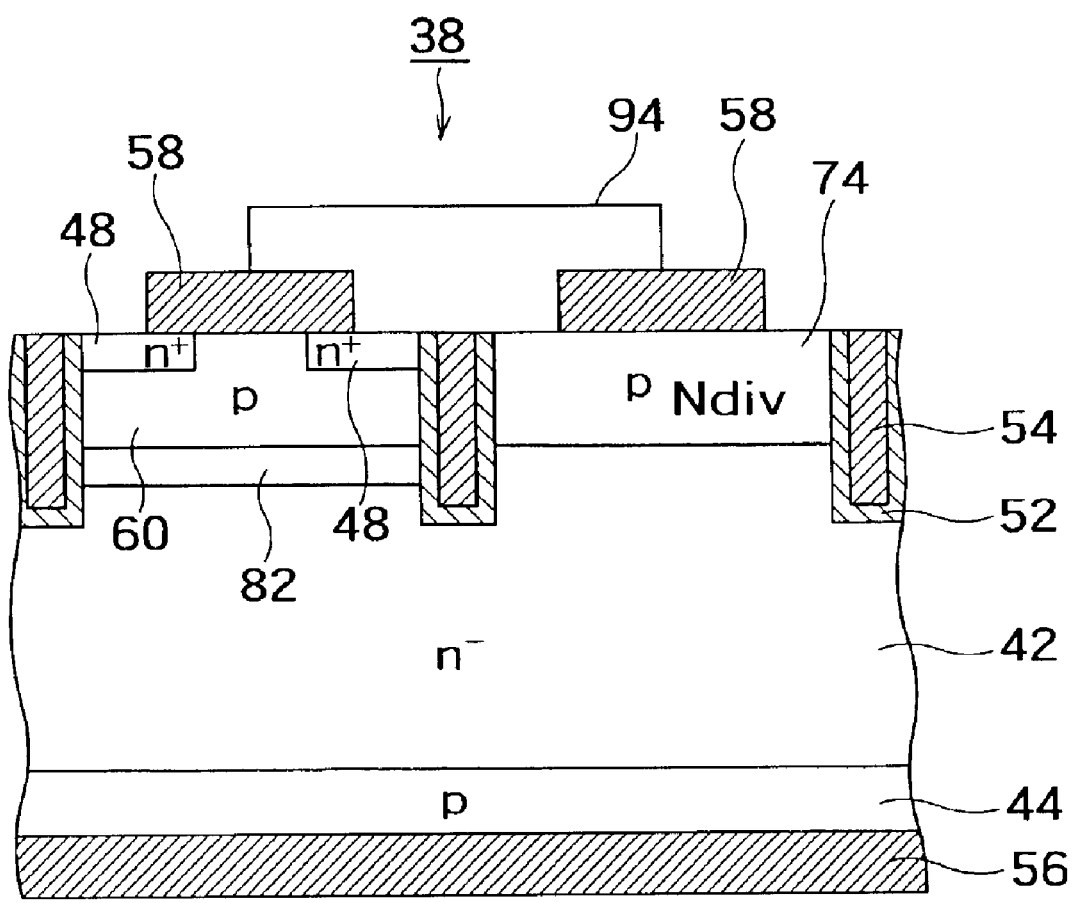
FIG. 26 is a sectional view showing the schematic constitution of a nineteenth embodiment of the semiconductor device according to the present invention.

FIG. 26 is a sectional view showing the schematic constitution of a nineteenth embodiment of the semiconductor device according to the present invention. An IGBT 38 shown in the figure is different from the IGBT 26 shown in FIG. 18 in that the n-type barrier layer 82 is disposed in the cell including the MOS channel. Even when the n-type barrier layer is disposed only in this channel cell, the on-resistance of the IGBT 38 can be reduced.

(20) Twentieth Embodiment

Figure 26A:
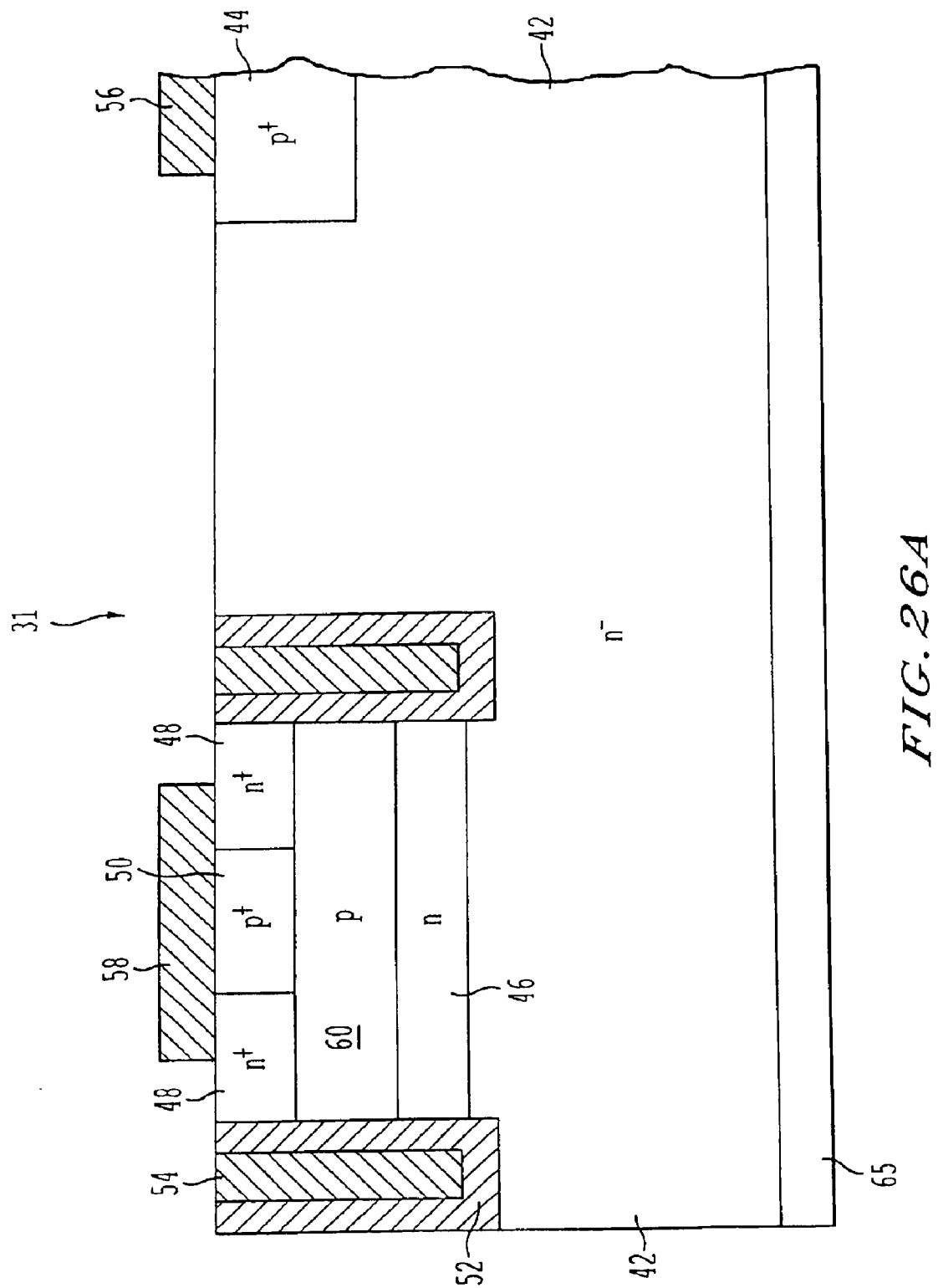
FIG. 26A is a sectional view showing the schematic constitution of a twentieth embodiment of the semiconductor device according to the present invention.

FIG. 26A is a sectional view showing the schematic constitution of a twentieth embodiment of the semiconductor device according to the present invention. In an IGBT 31 of the present embodiment, an emitter layer 44 of the second conductivity type is formed on the surface of the base layer 42 on the same side as that of the emitter electrode 58, and a collector electrode 56 is formed on the emitter layer 44 and electrically connected to the emitter layer 44.

The embodiments of the present invention have been described above, but the present invention is not limited to the above-described embodiments, and can variously be changed and applied within the scope and the spirit of the invention. For example, the cell arrangement shown in the perspective view of FIG. 8 or the plane view of FIG. 9 or 10 can also be applied to the ninth through eighteenth embodiments.

The twenty embodiments of the present invention have been described, but by arbitrarily combining these embodiments together, the semiconductor device can be realized in which the on-resistance is further low and the destruction tolerance is further high.

What is claimed is:

1. A semiconductor device comprising:
   a base layer of a first conductivity type;
      a barrier layer of the first conductivity type formed on the base layer;
      a well layer of a second conductivity type formed on said barrier layer;
      a first trench formed from the surface of the well layer to such a depth as to reach a region in the vicinity of a junction surface between the barrier layer and the base layer;
      a gate electrode formed in the first trench via a gate insulating film;
      a contact layer of the second conductivity type selectively formed in a surface portion of the well layer;
      a source layer of the first conductivity type selectively formed in the surface portion of the well layer so as to contact a side wall of the gate insulating film in the first trench and the contact layer; and
      a first main electrode formed so as to contact the contact layer and the source layer,
   wherein assuming that a total sum of impurity densities in the region of said barrier layer between the first trench and a second trench is Qn, said Qn has a relation of the following equation:

$$Qn \geq 2 \times 10^{12} \text{ cm}^{-2}.$$

2. The semiconductor device according to claim 1, wherein the region between the first and second trenches includes an active region for a current path, the active region having a width of 2 μm or less.

3. The semiconductor device according to claim 1, wherein the contact layer and the source layer are formed in the region between the first and second trenches so as to be alternately disposed in a direction along the region between the first and second trenches.

4. The semiconductor device according to claim 1, wherein the source layer is formed around the contact layer, and cells are arranged so as to form a matrix in a plane view.

5. The semiconductor device according to claim 1, wherein cells are arranged so as to form a plurality of columns in parallel with each other and at the same pitch along an arbitrary direction in a plane view, and a position of one end of the cell in an arbitrary column deviates in the arbitrary direction from that of the corresponding position of one end of the cell in the adjacent column.

6. The semiconductor device according to claim 1, which further comprises:
   an emitter layer of the second conductivity type formed on the surface of the base layer on a side opposite to a side on which the first main electrode is formed; and
   a second main electrode formed on the emitter layer and electrically connected to the emitter layer.

7. The semiconductor device according to claim 6, which further comprises a buffer layer of the first conductivity type formed between the emitter layer and the base layer.

8. The semiconductor device according to claim 1, which further comprises:
   an emitter layer of the second conductivity type formed on the surface of the base layer on the same side as that of the first main electrode; and
   a second main electrode formed on the emitter layer and electrically connected to the emitter layer.

9. The semiconductor device according to claim 1, wherein a region between the first trench and a third trench includes a dummy region which does not contribute to the operation of the device.

* * * * *